United States Patent
Ovshinsky et al.

(10) Patent No.: US 8,222,125 B2
(45) Date of Patent: Jul. 17, 2012

(54) PLASMA DEPOSITION OF AMORPHOUS SEMICONDUCTORS AT MICROWAVE FREQUENCIES

(75) Inventors: Stanford R. Ovshinsky, Bloomfield Hills, MI (US); David Strand, Bloomfield Township, MI (US); Patrick Klersy, Ortonville, MI (US); Boil Pashmakov, Troy, MI (US)

(73) Assignee: Ovshinsky Innovation, LLC, Bloomfield Hills, MI (US)

( * ) Notice: Subject to any disclaimer, the term of this patent is extended or adjusted under 35 U.S.C. 154(b) by 8 days.

(21) Appl. No.: 12/855,637

(22) Filed: Aug. 12, 2010

(65) Prior Publication Data

US 2012/0040492 A1 Feb. 16, 2012

(51) Int. Cl.
*H01L 21/20* (2006.01)
*H01L 21/205* (2006.01)
*C23C 16/00* (2006.01)
*C23C 16/24* (2006.01)
*C23C 16/50* (2006.01)
*C23C 16/511* (2006.01)

(52) U.S. Cl. .................... 438/485; 438/96; 118/723 ME; 427/255.393; 427/575; 427/578; 427/595

(58) Field of Classification Search .................. 438/96, 438/482, 485; 118/723 ME; 136/261; 427/255.393, 427/575, 578, 595
See application file for complete search history.

(56) References Cited

U.S. PATENT DOCUMENTS

| | | | | |
|---|---|---|---|---|
| 4,492,810 A | * | 1/1985 | Ovshinsky et al. | 136/255 |
| 4,504,518 A | * | 3/1985 | Ovshinsky et al. | 427/575 |
| 4,517,223 A | | 5/1985 | Ovshinsky | |
| 4,521,447 A | | 6/1985 | Ovshinsky | |
| 4,605,941 A | | 8/1986 | Ovshinsky | |
| 4,785,763 A | * | 11/1988 | Saitoh | 118/723 MW |
| 4,839,312 A | | 6/1989 | Ovsinsky | |
| 4,840,139 A | * | 6/1989 | Takei | 118/723 MW |
| 4,897,281 A | * | 1/1990 | Arai et al. | 427/8 |
| 4,897,284 A | * | 1/1990 | Arai et al. | 427/573 |
| 4,898,798 A | * | 2/1990 | Sugata et al. | 430/58.1 |
| 4,930,442 A | * | 6/1990 | Iida et al. | 118/723 MW |
| 4,931,756 A | * | 6/1990 | Doehler et al. | 333/252 |
| 4,954,397 A | * | 9/1990 | Amada et al. | 430/57.7 |
| 4,960,071 A | * | 10/1990 | Akahori et al. | 118/722 |
| 4,972,799 A | * | 11/1990 | Misumi et al. | 118/723 MW |
| 5,038,712 A | * | 8/1991 | Fujiyama | 118/723 MW |
| 5,103,284 A | | 4/1992 | Ovshinsky | |
| 5,232,507 A | * | 8/1993 | Ohtoshi et al. | 118/719 |

(Continued)

FOREIGN PATENT DOCUMENTS

JP 64-272 * 1/1989

(Continued)

*Primary Examiner* — Mary Wilczewski
(74) *Attorney, Agent, or Firm* — Kevin L. Bray

(57) ABSTRACT

Apparatus and method for plasma deposition of thin film photovoltaic materials at microwave frequencies. The apparatus avoids deposition on windows or other microwave transmission elements that couple microwave energy to deposition species. The apparatus includes a microwave applicator with conduits passing therethrough that carry deposition species. The applicator transfers microwave energy to the deposition species to transform them to a reactive state conducive to formation of a thin film material. The conduits physically isolate deposition species that would react to form a thin film material at the point of microwave power transfer. The deposition species are separately energized and swept away from the point of power transfer to prevent thin film deposition. The invention allows for the ultrafast formation of silicon-containing amorphous semiconductors that exhibit high mobility, low porosity, little or no Staebler-Wronski degradation, and low defect concentration.

18 Claims, 15 Drawing Sheets

U.S. PATENT DOCUMENTS

| | | | |
|---|---|---|---|
| 5,273,587 A * | 12/1993 | Guha et al. | 118/723 MW |
| 5,284,544 A * | 2/1994 | Mizutani et al. | 156/345.38 |
| 5,310,426 A * | 5/1994 | Mori | 118/723 AN |
| 5,324,553 A | 6/1994 | Ovshinsky | |
| 5,433,790 A * | 7/1995 | Niino et al. | 118/723 MW |
| 5,439,715 A * | 8/1995 | Okamura et al. | 427/575 |
| 5,453,125 A * | 9/1995 | Krogh | 118/723 MR |
| 5,503,676 A * | 4/1996 | Shufflebotham et al. | 118/723 MR |
| 6,029,602 A * | 2/2000 | Bhatnagar | 118/723 ME |
| 6,366,346 B1 * | 4/2002 | Nowak et al. | 356/72 |
| 6,764,606 B2 * | 7/2004 | Yanase | 216/75 |
| 7,302,910 B2 * | 12/2007 | Ishii | 118/723 MW |
| 7,303,790 B2 * | 12/2007 | Delaunay et al. | 427/571 |
| 8,048,782 B1 * | 11/2011 | Ovshinsky et al. | 438/482 |
| 8,101,245 B1 * | 1/2012 | Ovshinsky et al. | 427/575 |
| 2003/0066486 A1 * | 4/2003 | Zheng et al. | 118/723 ME |
| 2004/0011291 A1 * | 1/2004 | Delaunay et al. | 118/723 MA |

FOREIGN PATENT DOCUMENTS

| | | | |
|---|---|---|---|
| JP | 2-175878 | * | 7/1990 |
| JP | 3-31481 | * | 2/1991 |

* cited by examiner

PLASMA DEPOSITION OF AMORPHOUS SEMICONDUCTORS AT MICROWAVE FREQUENCIES

FIELD OF INVENTION

The invention establishes a new realm of plasma chemistry and physics that enables the deposition of unique atomically-engineered multi-element compositions for photovoltaic applications that free the world from its dependence on fossil fuels. More particularly, this invention solves the problem of depositing silicon-containing semiconductors at high deposition rates to achieve highly efficient photovoltaic materials with a low density of states that exhibit no Staebler-Wronski degradation. Most particularly, this invention relates to plasma deposition of amorphous, nanocrystalline, microcrystalline, polycrystalline or single crystalline semiconductors at microwave frequencies from multiple source gases, one of which includes fluorine, in a process that avoids undesirable coatings on microwave windows.

BACKGROUND OF THE INVENTION

Concern over the depletion and environmental impact of fossil fuels has stimulated strong interest in the development of alternative energy sources. Significant investments in areas such as batteries, fuel cells, hydrogen production and storage, biomass, wind power, algae, and solar energy have been made as society seeks to develop new ways of creating and storing energy in an economically-competitive and environmentally-benign fashion. The ultimate objective is to minimize society's reliance on fossil fuels and to avoid production of greenhouse gases.

A number of experts has concluded that to avoid the serious consequences of global warming, it is necessary to maintain $CO_2$ at levels of 350 ppm or less. To meet this target, based on current projections of world energy usage, the world will need 17 TW of carbon-free energy by the year 2050 and 33 TW by the year 2100. The estimated contribution of various carbon-free sources toward the year 2050 goal are summarized below:

| Source | Projected Energy Supply (TW) |
|---|---|
| Wind | 2-4 |
| Tidal | 2 |
| Hydro | 1.6 |
| Biofuels | 5-7 |
| Geothermal | 2-4 |
| Solar | 600 |

Based on the expected supply of energy from the available carbon-free sources, solar energy is clearly the most viable solution for reducing greenhouse emissions and alleviating the effects of global climate change. (See J. Esch, "Keeping the Energy Debate Clean How Do We Supply the World's Energy Needs?", IEEE Proc. 98(1), 39-41 (2010).)

Amorphous semiconductors are attractive materials for solar energy applications. Among the amorphous semiconductors, amorphous silicon is known to be a particularly promising solar energy material. Unlike crystalline silicon, amorphous silicon is a direct gap material that has strong absorption over much of the solar spectrum. The strong absorption means that high efficiency solar cells can be formed from thin layers of amorphous silicon. As a result, solar panels based on amorphous silicon (or chemically-modified or structurally-modified forms of amorphous silicon, including composite forms of amorphous silicon that include nanocrystalline phases) are lightweight, flexible, and readily adapted to field use in a variety of installation environments.

S. R. Ovshinsky has long recognized the advantages of amorphous silicon and related materials as the active layer of solar cells and has been instrumental through his inventions and developments in advancing automated and continuous manufacturing techniques for producing solar and photovoltaic devices based on amorphous semiconductors or combinations of amorphous semiconductors with nanocrystalline, microcrystalline, polycrystalline or single crystalline semiconductors. Representative discoveries of S. R. Ovshinsky in the field of amorphous semiconductors and photovoltaic materials include U.S. Pat. Nos. 4,400,409 (describing a continuous manufacturing process for making thin film photovoltaic films and devices); 4,410,588 (describing an apparatus for the continuous manufacturing of thin film photovoltaic solar cells); 4,438,723 (describing an apparatus having multiple deposition chambers for the continuous manufacturing of multilayer photovoltaic devices); 4,217,374 (describing suitability of amorphous silicon and related materials as the active material in several semiconducting devices); 4,226,898 (demonstration of solar cells having multiple layers, including n- and p-doped); 5,103,284 (deposition of nanocrystalline silicon and demonstration of advantages thereof); and 5,324,553 (microwave deposition of thin film photovoltaic materials).

Current efforts in thin film photovoltaic material manufacturing are directed at increasing the deposition rate without impairing photovoltaic efficiency and, in the case of silicon-containing materials, without exacerbating Staebler-Wronski degradation. Higher deposition rates lower the cost of thin film solar cells and can lead to a dramatic decrease in the unit cost of electricity obtained from solar energy. As the deposition rate increases, thin film photovoltaic materials become increasingly competitive with fossil fuels as a source of energy. Presently, PECVD (plasma-enhanced chemical vapor deposition) is the most cost-effective method for the commercial-scale manufacturing of amorphous silicon and related amorphous semiconductor photovoltaic materials. Current PECVD processes provide uniform coverage of large-area substrates with device quality photovoltaic material at deposition rates of ~1-5 Å/s. This deposition rate, however, is insufficient to achieve cost parity with fossil fuels.

In order to enhance the economic competitiveness of plasma deposition processes, it is desirable to increase the deposition rate. To effectively compete with fossil fuels, it is believed that deposition rates of 100 Å/s or higher are needed. The deposition rate of prevailing plasma deposition techniques is limited by the high concentration of intrinsic defects that develops in amorphous solar materials as the deposition rate is increased. The intrinsic defects include structural defects such as dangling bonds, strained bonds, unpassivated surface states, non-tetrahedral bonding distortions, and coordinatively unsaturated atoms (e.g. two- or three-fold coordinated silicon or germanium). The structural defects create electronic states in the bandgap and near the band edges of amorphous semiconductors. The electronic states detract from solar conversion efficiency by (1) promoting nonradiative recombination processes that deplete the concentration of free carriers generated by absorbed sunlight and (2) reducing hole mobility. Intrinsic defects also contribute to degradation of the solar conversion efficiency of amorphous silicon and related materials through the Staebler-Wronski effect, an effect that leads to a 15-30% reduction in photovoltaic efficiency with use over time.

S. R. Ovshinsky has demonstrated that the concentration of intrinsic defects formed in a plasma-deposited material depends on the distribution of species present in the plasma. A plasma is a complex state of matter that includes ions, ion-radicals, neutral radicals and molecules in multiple energetic states. In particular, S. R. Ovshinsky has shown that certain charged species can be detrimental to the quality of as-deposited amorphous semiconductors under conditions in which they promote the creation of defects. Uncontrolled charged species tend to strike the deposition surface with high kinetic energy and damage a growing thin film material through bond cleavage. Bond cleavage creates dangling bonds and promotes the formation of locally strained coordination environments that may contribute to electronic defect states. S. R. Ovshinsky has shown that neutral species in a plasma, in contrast, frequently promote more uniform bonding and lead to lower defect concentrations in as-deposited material. S. R. Ovshinsky has ultimately showed that the proper balance of charged and neutral species is essential to maximizing deposition rate and minimizing defects. He has further demonstrated that the optimal identity, concentration, and charge of species in a plasma environment varies with plasma conditions and can be constructively influenced through chemical modification with agents such as fluorine.

To minimize the concentration of intrinsic defects, current plasma deposition processes are performed at low deposition rates. By slowing the deposition process, the intrinsic defects that form in the as-deposited product material have the opportunity to equilibrate to energetically-favored states that have more regular bonding configurations. As a result, the concentration of intrinsic defects is reduced. Unfortunately, the reduced deposition rate impairs the economic competitiveness of the process and prevents cost parity with fossil fuels.

In U.S. patent application Ser. Nos. 12/199,656; 12/209, 699; and 12/429,637; S. R. Ovshinsky described techniques for minimizing the deleterious effect of uncontrolled charged plasma species on the defect concentration. The patent applications describe techniques for maximizing the presence of neutral species and controlling the presence and activity of charged species at the deposition surface through preferential formation of neutral species in the plasma activation process, magnetic confinement to regulate charged species, and/or separation of undesirable charged species to form a charge-controlled deposition medium. Through utilization of a charge-controlled deposition medium, high quality amorphous or other silicon-containing semiconductors can be formed at high deposition rates in a plasma deposition process.

Another strategy for increasing the deposition rate of plasma-based processes is to increase the plasma frequency. Conventional plasma deposition processes are typically completed at radiofrequencies (e.g. 13.56 MHz). As the plasma frequency is increased, the source gases used in plasma deposition are activated more efficiently, more completely, and to higher energy states. Plasma excitation at microwave frequencies (e.g. 2.45 GHz), for example, leads to higher dissociation rates of source gases, generates higher fluxes of ions and neutrals, and creates a higher proportion of plasma species (ions, neutrals) sufficiently energetic to participate in the deposition process. The high dissociation rates and higher excitation energies associated with microwave plasmas improve process efficiency by providing much higher utilization of source gases than radiofrequency plasmas. The high fluxes and energies of ions and neutrals produced by microwave plasmas lead to significantly higher thin film deposition rates than radiofrequency plasmas.

In addition to dissociation of a higher fraction of source gases, the high deposition rate accompanying microwave deposition of thin film precursors is also a consequence of the enhanced reactivity of deposition intermediates. Enhanced reactivity of deposition intermediates results from the higher energy of activation available from microwave excitation. Microwave excitation produces deposition intermediates with higher internal energy by activating deposition precursors to higher energy electronic and vibrational excited states. The higher internal energy makes the deposition intermediates less stable and more conducive to the structural rearrangements and reactions on the deposition surface needed to form a thin film material.

Although enhanced reactivity of deposition precursors is beneficial from the standpoint of deposition rate, it oftentimes leads to unintended side effects. A common problem in microwave deposition is the tendency of reactive deposition intermediates to form thin films away from the substrate. Thin film coatings, for example, may develop on the interior walls of the deposition chamber and may serve as a source of contamination for subsequent depositions.

Since the deposition chamber is normally operated under vacuum or with a controlled atmosphere, it has a limited volume and receives precursors, background gases, and energy from external sources. Materials are generally delivered by conduits through valves that pierce the boundaries of the chamber. Electrical energy (such as the bias between electrodes needed to initiate a plasma or the resistive dissipation used to heat a substrate) is typically supplied by wires that connect an external power source through the boundaries of the chamber to internal components. The formation of thin film coatings on the openings or actuators of internal valves, or on internal components such as electrodes or wires, may alter deposition conditions, impair the uniformity of deposition or prevent deposition altogether.

Unintended thin film coatings are particularly problematic when they form on the windows of a deposition chamber through which the electromagnetic energy used to activate a plasma from deposition precursors is transmitted. In microwave deposition, for example, the microwave generator is normally located remote from the deposition chamber. The generator produces microwaves and transmits them along a microwave waveguide to the deposition chamber or a downstream applicator, where the microwaves pass through a window to energize deposition intermediates or activate deposition precursors to form reactive species used to form a thin film material. To maximize the microwave energy coupled to the deposition intermediates or precursors, it is necessary to insure that the window is highly transparent to microwave frequencies. If the reactive species generated by the microwaves deposit the thin film material on the window and the thin film material absorbs microwaves, the transparency of the window decreases.

Decreased transparency of the window leads to two detrimental effects. First, any decrease in transparency leads to a reduction in the microwave energy coupled to the deposition intermediates or precursors. Reduced microwave coupling means that the deposition species are less dissociated, less energetic, less reactive, and as a result, the deposition rate decreases. Second, continued exposure of a microwave-absorptive thin film on the window to microwave radiation leads to localized heating of the thin film material that can cause thermal stresses and potentially catastrophic failure of the window.

The detrimental consequences of thin film coatings on microwave transmission windows do not arise if the coating is transparent to microwave radiation. Most dielectrics (including quartz, sapphire, diamond, boron carbide, $SiO_2$, and $Si_3N_4$) are highly transparent to microwave radiation and may be formed safely at high deposition rates in a microwave plasma process. Coatings made from lower bandgap materials (including metals and most semiconductors), however, are much less transparent to microwave radiation and present much more serious concerns over safety and process consistency. Many desirable photovoltaic materials, including amorphous silicon and silicon-germanium, absorb microwave radiation and are difficult to manufacture in a microwave plasma process because the high reactivity conditions present in a microwave plasma promotes the formation of undesirable coatings on the windows used to transmit microwave radiation to the deposition environment. Accordingly, there is a need for a process that permits microwave deposition of semiconducting photovoltaic materials.

SUMMARY OF THE INVENTION

The amount of energy absorbed by the Earth's atmosphere, oceans and land masses in one hour is more than the amount of energy used by people on Earth in one year. This fact reveals that solar energy is the ultimate solution to eliminating mankind's dependence on fossil fuels. Implementation of solar energy on a scale sufficient to meaningfully reduce fossil fuel consumption has been hindered, however, by economics and concerns about cost. Dr. Steven Chu, winner of a Nobel Prize in physics and presently the Secretary of Energy, summed up the problem in a New York Times article that appeared on Feb. 12, 2009, by stating that a revolution in science and technology would be needed if the world is to reduce its dependence on fossil fuels and curb the emissions of carbon dioxide and other heat-trapping gases linked to global warming. Dr. Chu also stated that a five-fold improvement in solar technology was needed to adequately address global warming and reduce the world's dependence on fossil fuels. This invention can be summarized most simply as providing the revolution and improvement in solar technology that Dr. Chu referred to.

With the invention, the unit cost of solar energy is at or below the cost of fossil fuels. As a result, widespread implementation of the instant invention will allow mankind to reduce its dependence on fossil fuels and serves the higher goal of democratizing energy by enabling all countries, regardless of natural resources, to become self-sufficient in energy. Concerns over the scarcity of fossil fuels, conflicts over sources of fossil fuel will be eliminated, and national and worldwide security will be enhanced.

The invention is predicated on a fundamental advance in plasma chemistry and physics that allows for a tremendous increase in the throughput and deposition rate of photovoltaic materials containing Group IV elements (e.g. Si, Ge, Sn) in a continuous manufacturing process. The fundamental advance in plasma chemistry and physics enables a unique atomic engineering of multi-element compositions that affords a method of controlling and forming thin film photovoltaic materials in the presence of a microwave plasma. With the invention, the deposition rate of thin film photovoltaic materials based on silicon can be dramatically increased for the first time without introducing the defects, the density of states and Staebler-Wronski degradation that have heretofore diminished photovoltaic efficiency and frustrated efforts to achieve cost parity with fossil fuels.

The invention enables for the first time a gigawatt or more of manufacturing capacity in a single machine of a size that fits within an ordinary manufacturing plant. Because of this invention, it will no longer be necessary to run multiple manufacturing processes in multiple locations in parallel or to build multiple machines in series to realize output on the gigawatt scale. The tremendous cost reduction afforded by this invention will motivate the development of new industries that will provide high-valued jobs that stimulate the economy and promote the educational system.

The foregoing benefits of the instant invention are more particularly realized in the exemplary embodiments now summarized:

This invention provides a method and apparatus for the microwave deposition of atomically-engineered, multi-element, silicon-containing photovoltaic materials with unique chemical bonding and structural configurations, resulting in new physics. The invention provides the high deposition rate advantage associated with microwave deposition, while avoiding or minimizing the problems of (1) forming unintended coatings in the deposition chamber or on the windows used to transmit microwave radiation; (2) creating electronic defect states in the bandgap that detract from photovoltaic efficiency; and (3) degradation of photovoltaic efficiency over time upon continuous exposure of the material to incident radiation during operation due to the Staebler-Wronski effect.

The silicon-containing photovoltaic material provided by the instant invention is a thin film material that can be formed at high speeds without compromising the quality of the material. The invention solves the heretofore insurmountable problem of realizing the benefit of high rate deposition from microwave plasma excitation without creating a high concentration of structural or electronic defects that produce a high density of states in the bandgap. The thin film material of the instant invention features new bonding relationships that provide a low concentration of defects, a low density of states, a dense, non-porous structure, and little or no Staebler-Wronski degradation. The instant invention constitutes the advent of a new regime of deposition conditions that exploits fundamentally new physics and chemistry to achieve superior performance of photovoltaic materials based on silicon (and other fourfold coordinate elements) in an ultrafast deposition process. Silicon-based materials available from the instant invention include materials that have an amorphous, nanocrystalline, microcrystalline, polycrystalline, or single crystalline structure as well as materials that combine two or more of such structures.

This invention reduces or eliminates the Staebler-Wronski effect by using fluorine in a microwave plasma to engineer the deposition environment to insure formation of silicon-containing photovoltaic materials with improved bonding and unique structural configurations. Fluorine is active not only in the plasma, but also within and on the surface of the product material. The beneficial effect of fluorine enables the deposition of silicon-containing photovoltaic materials with a low density of states and essentially no Staebler-Wronski degradation at heretofore unattainable rates.

The apparatus generally includes a microwave generator, microwave waveguide, microwave applicator, and deposition chamber. The microwave generator produces microwaves and launches them down the waveguide toward the applicator. The applicator couples the microwaves to deposition species flowing through one or more conduits that pass through the applicator. The conduits are formed from a material that transmits microwave radiation to permit coupling of microwave energy to the deposition species. The deposition species may be neutral precursors in a ground or excited energetic state, ionized precursors, free radicals formed from a neutral precursor, or constituents of a plasma. Coupling of microwave energy to the deposition species energizes them to promote reactivity and increase deposition rate. The energized deposition species exit the one or more conduits, enter the deposition chamber, and form a thin film material on a substrate. The process may further include the introduction of one or more supplemental material streams to the deposition chamber that have not been subjected to microwave excitation. The supplemental material streams may combine with the energized species exiting the one or more conduits to provide a deposition medium from which a thin film material is formed.

The thin film material is generally a semiconductor or amorphous semiconductor material. The thin film material typically includes silicon and/or germanium and may be an intrinsic semiconductor or a semiconductor doped n-type or p-type. Embodiments include silicon, germanium, and alloys of silicon and germanium in amorphous, nanocrystalline, microcrystalline and/or polycrystalline forms. The materials also include hydrogenated and/or fluorinated variants.

Deposition species include silane, fluorosilanes, germane, fluorogermanes, and mixtures thereof. Deposition species may also include treatment gases that passivate or modify the surface of the thin film material. Treatment gases may or may not provide elements that are incorporated into the thin film material. Treatment gases include hydrogen, hydrogen fluoride, fluorine, and noble gases. Carrier gases such as argon, neon or helium may also be combined with one or more deposition species or treatment gases in a conduit of the applicator.

The presence of fluorine in the microwave deposition environment (whether from a deposition precursor, treatment gas, or supplemental material stream) is believed to facilitate new structural organizations of the multiple elements present in the environment at or adjacent to the deposition surface. The new structural organizations are a new form of atomic engineering that enables the high speed formation of silicon-containing photovoltaic materials in a bonding configuration that avoids defects, improves photovoltaic efficiency, and prevents Staebler-Wronski degradation. The effective amount of fluorine incorporated into the product film ranges from 0.1% up to the etching threshold of fluorine. The etching threshold of fluorine corresponds to the concentration of fluorine at which detrimental etching of the product film begins. The etching threshold of fluorine depends on the characteristics of the deposition environment, including the concentration of hydrogen. In one embodiment, the etching threshold of fluorine is about 7%.

The conduits of the microwave applicator are transparent to microwave radiation and are formed from a dielectric material, such as an oxide or nitride. Representative dielectric materials include $SiO_2$, quartz, $Al_2O_3$, sapphire, transition metal oxides, silicon nitride, and aluminum nitride.

In one embodiment, the applicator includes two or more conduits, each of which carries a different deposition species. The conduits may be physically separated or one conduit may be concentric with or otherwise housed within another. The conduits may be oriented in a direction aligned or non-aligned with the direction of microwave propagation in the applicator. In one embodiment, the conduits are oriented perpendicular to the direction of microwave propagation.

One or more deposition species and/or carrier gases enter each of the conduits of the applicator and are energized by microwave radiation. In one embodiment, the deposition species or carrier gases in each of two or more conduits are energized with a common source of microwave radiation. In another embodiment, separate sources of microwave radiation are used to energize deposition species or carrier gases in two or more conduits. The energized deposition species and/or carrier gases exit the conduits and enter a deposition chamber. In the deposition chamber, the energized deposition species are directed to a substrate and a thin film material is formed. The substrate may be stationary or mobile. In one embodiment, the substrate is a continuous web.

The deposition chamber may further include one or more injection ports for delivering supplemental material streams to the substrate. The supplemental material streams may include precursors, intermediates, treatment gases, background gases or carrier gases. The supplemental material streams may combine with the energized deposition medium entering the chamber in the vicinity of the substrate and may participate in the deposition process by reacting or interacting with the energized deposition medium to influence the composition or characteristics of the deposited thin film material.

The deposition chamber may also include a supplemental energizing source to prevent or slow relaxation or decay of the energized species entering the deposition chamber from one or more conduits of the microwave applicator. The supplemental energy source can also be used to activate species in the deposition chamber to form intermediate species through bond cleavage. The presence of fluorine, for example, can be increased by activating $SiF_4$ to cleave an Si—F bond to liberate fluorine. In one embodiment, the supplemental energy source is an electromagnetic source that includes an antenna array. The antenna array may generate or sustain an electromagnetic field and may further provide phase control. In one embodiment, the electromagnetic field is a microwave field.

The deposition chamber is further equipped with means to meter, monitor, modulate and calibrate the presence and distribution of species in the growth ambient. This capability permits fine control over the ratios of the multiple elements in deposition environment to insure optimum conditions for high speed deposition. The relative amounts of fluorine and hydrogen are particularly important to the success of the invention. It is desirable to maximize the concentration of fluorine in the product film, but the presence of too much fluorine in the growth ambient promotes an undesirable etching effect that increases the porosity of the product film. The presence of hydrogen in the product film can aid in passivating defects, but too much hydrogen promotes the Staebler-Wronski effect. In addition, fluorine and hydrogen can interact with each other to deplete the concentration of fluorine and/or hydrogen available to assist the process of depositing the product film or to become incorporated into the product film. Proper control of the ratio of fluorine to hydrogen is important to realizing the superior photovoltaic materials available from this invention. In one embodiment, it is desirable to maximize the presence of fluorine in an energized state and to minimize the presence of hydrogen in an energized state.

The deposition chamber may be interconnected to one or more additional deposition or processing units. Additional deposition units permit the formation of multilayer thin film structures that include materials of different composition. Thin film structures include p-n junctions, p-i-n structures, tandem cells, or triple junction cells, where at least one layer is formed according to the instant invention.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein and including embodiments that provide positive benefits for high-volume manufacturing, are also within the scope of this invention. Accordingly, the scope of the invention is defined only by reference to the appended claims.

Figure 1:
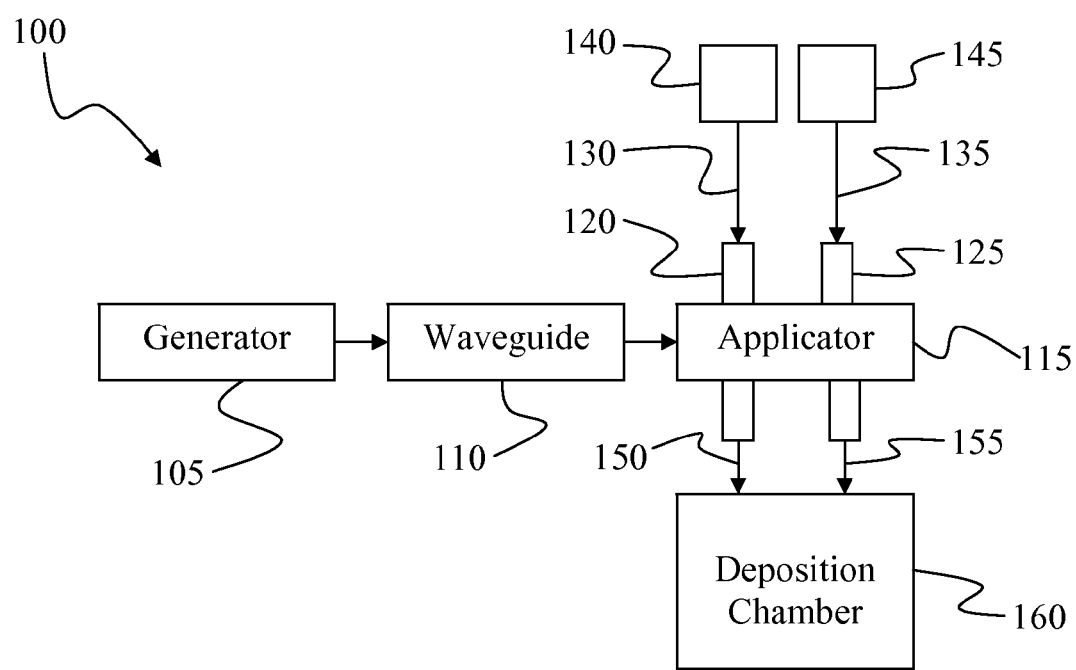
FIG. 1 depicts a system for the microwave deposition of thin film materials.

The instant invention provides an apparatus and method for microwave plasma deposition of thin film materials. The invention is especially suited for the microwave plasma deposition of materials that absorb microwave radiation. A schematic of a microwave deposition system is depicted in FIG. 1. System 100 includes microwave generator 105 that creates a field of microwave radiation and launches it through microwave waveguide 110 to microwave applicator 115. Microwave generator 105 typically includes a magnetron and delivers a field of microwave radiation at a single frequency (e.g. 915 MHz, 2.45 GHz, 5.8 GHz). Applicator 115 couples the microwave radiation to deposition species passing through conduits 120 and 125. Conduit 120 receives one or more deposition species in stream 130 from source 140 and conduit 125 receives one or more deposition species in stream 135 from source 145. The microwave radiation couples to deposition species provided to conduits 120 and 125 to produce streams 150 and 155, respectively, containing energized deposition species that are delivered to deposition chamber 160 for formation of a thin film.

Although not shown, the deposition system may further include an isolator directly after microwave generator 105 to protect it from back-reflected microwave radiation. The isolator includes a circulator and a dummy load to neutralize back-reflected microwaves. The deposition system may also include a directional coupler in the waveguide run to detect and monitor forward and reflected microwave power, and a tuner to match the impedance of the load with the impedance of the source. Adjustment of the tuner minimizes the reflected power level. A termination device or sliding short circuit may also be connected to the downstream end of the applicator to assist with impedance matching or to establish a standing wave condition that maximizes microwave power in the vicinity of the conduits to increase the transfer of microwave power to the deposition species.

Applicator 115 may include two or more conduits for delivering deposition species to a region of microwave coupling (power transfer). The conduits provide for physical separation of two or more streams containing deposition precursors, while permitting simultaneous microwave excitation of the individual streams. The conduits receive deposition species from a source and transport them to an interior cavity of the applicator for coupling to the microwave radiation provided by waveguide 110. The coupling transfers energy from the microwave radiation to the deposition species to activate or otherwise energize them to a high energy state. The energized deposition species are then delivered by the conduits to the deposition chamber for deposition of a thin film material.

The high energy state created by transfer of microwave power is a reactive state and enhances reactions between deposition species. The rates of reactions between deposition species that occur in a non-energized state are generally increased when the deposition species are placed in an energized state and reactions that do not otherwise occur between deposition species may be induced in the energized state. Physical separation of the deposition species by the conduits provides the benefit of preventing reactions between deposition species in the region where microwave power (or energy) is transferred to the deposition species. As a result, the formation of thin film materials in the region of power transfer is avoided.

Figure 2:
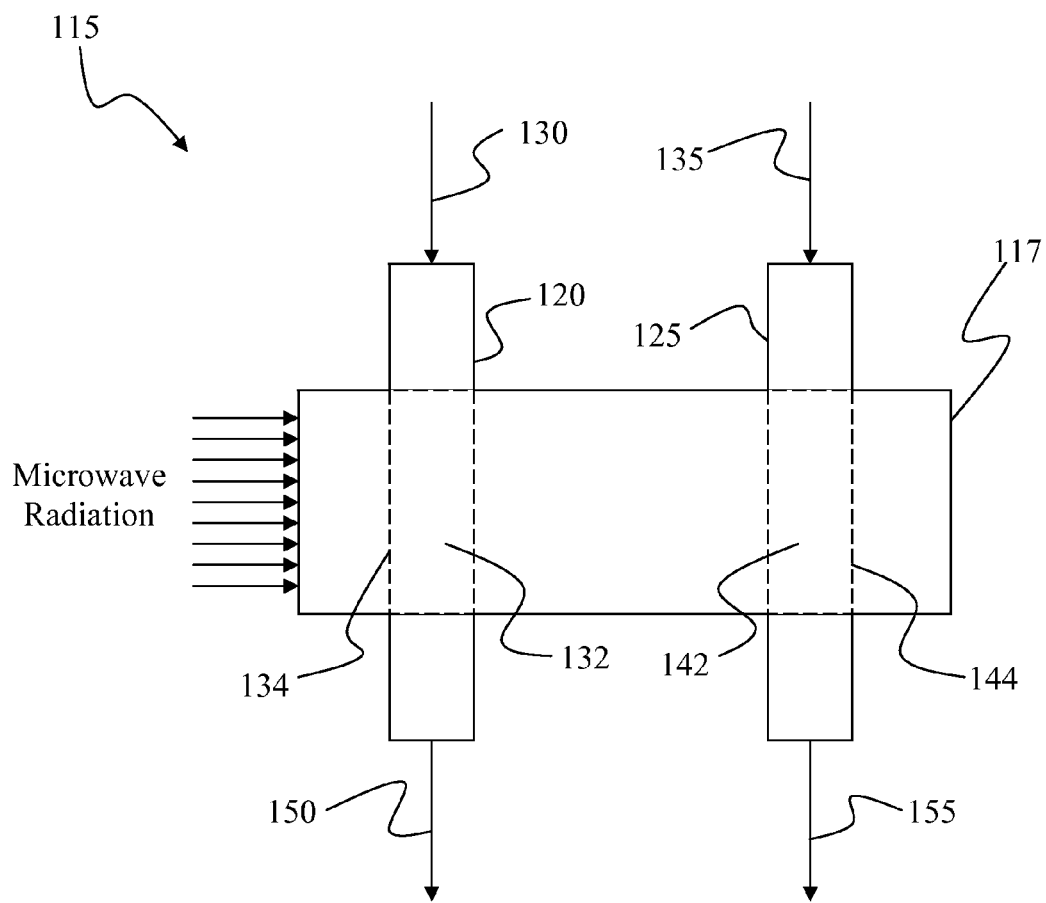
FIG. 2 depicts in side view an embodiment of a microwave applicator with conduits delivering different deposition species.

FIG. 2 shows an enlargement of applicator 115 in side view. Microwave radiation from waveguide 110 enters cavity 117, which couples microwave radiation to the deposition species in streams 130 and 135. In particular, cavity 117 is configured to transfer microwave power or energy to the deposition species in streams 130 and 135 in regions 132 and 142, respectively. Regions 132 and 142 correspond to the regions of transfer of microwave power (or energy) to streams 130 and 135, respectively, and coincide with the interior portions of conduits 120 and 125, respectively, that pass through the interior of applicator 115.

Microwave transfer region 132 includes boundary or window 134 that transmits microwave radiation through conduit 120 to deposition species in stream 130. Microwave transfer region 142 includes boundary or window 144 that transmits microwave radiation through conduit 125 to deposition species in stream 135. Transfer of microwave power (or energy) to deposition species in stream 130 produces energized deposition species that exit applicator 115 in stream 150. Transfer of microwave power (or energy) to deposition species in stream 135 produces energized deposition species that exit applicator 115 in stream 155.

To increase the deposition rate of a thin film material in deposition chamber 160, it is desirable to maximize the transfer of microwave power (or energy) to the deposition species transported through conduits 120 and 125. Greater transfer of microwave power (or energy) leads to more complete excitation or activation of the deposition species, a higher overall energy for the deposition species, greater dissociation, and greater reactivity. In one embodiment, the efficiency of transfer of microwave power (or energy) to the deposition species is increased by forming a standing wave of microwave radiation in cavity 117 of applicator 115 and locating one or both of conduits 120 and 125 so that deposition streams 130 and/or 135 pass through a region of maximum or locally maximum intensity of the standing wave pattern. A standing wave can be formed from the field of microwave radiation that enters cavity 117 by adjusting the length of the cavity or by attaching a termination device or sliding short to the cavity.

Physical separation of streams 130 and 135 in the region of microwave power (or energy) transfer prevents reactions between energized deposition species in stream 150 and energized deposition species in stream 155 that might otherwise occur to form a coating on the conduit windows. By delaying the interaction of the energized deposition species in streams 150 and 155 until after delivery into deposition chamber 160, the formation of a thin film material occurs away from the region of microwave power (or energy) transfer and the coating of conduit windows is avoided.

Figure 3A:
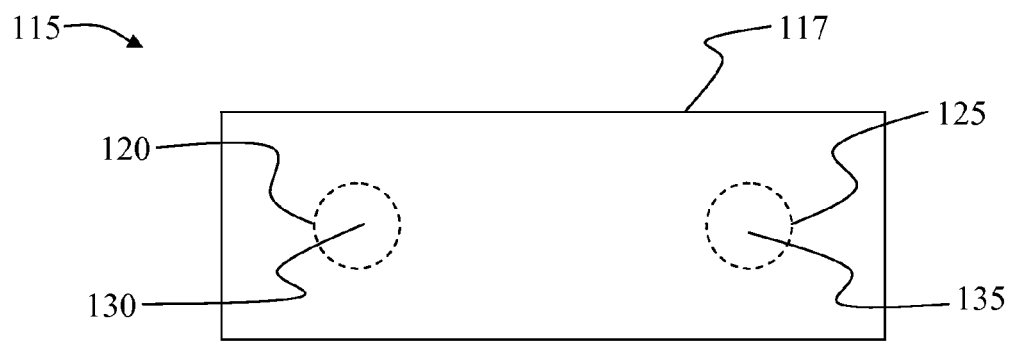
FIGS. 3A-3E depict in top view embodiments of a microwave applicator with conduits delivering different deposition species.
Figure 3B:
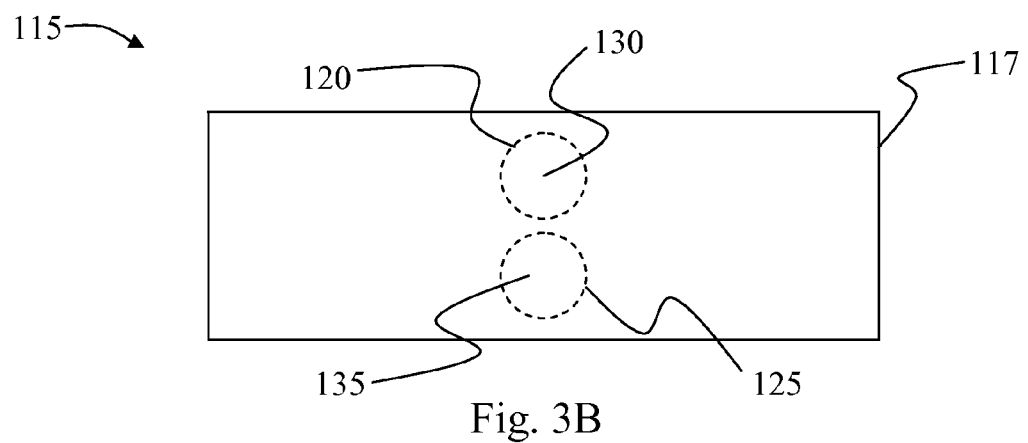

FIG. 3A depicts cavity 117, conduits 120 and 125, and deposition streams 130 and 135 as shown in FIG. 1 in top view. In the embodiment of FIG. 3A, conduits 120 and 125 have a generally circular cross-section. In other embodiments, the cross-section of the conduits may have another cross-sectional shape, including elliptical, oval, square, rectangular, polygonal, or other closed contour. The cross-sectional shape and/or dimensions may also differ for the different conduits introduced into cavity 117 of applicator 115. In the embodiment of FIG. 3A, conduits 120 and 125 are generally aligned in the direction of microwave propagation. In other embodiments, the positions of conduits 120 and 125 may be non-aligned in the direction of microwave propagation. FIG. 3B, for example, illustrates an embodiment in which conduits 120 and 125 are aligned in a direction generally orthogonal to the direction of microwave propagation. The scope of the invention extends to arbitrary placement or orientation of two or more conduits relative to the direction of microwave propagation.

Figure 3C:
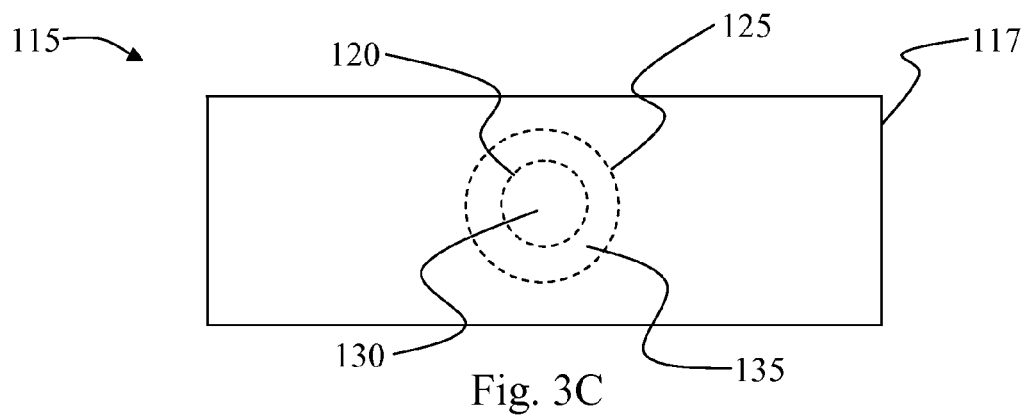
Figure 3D:
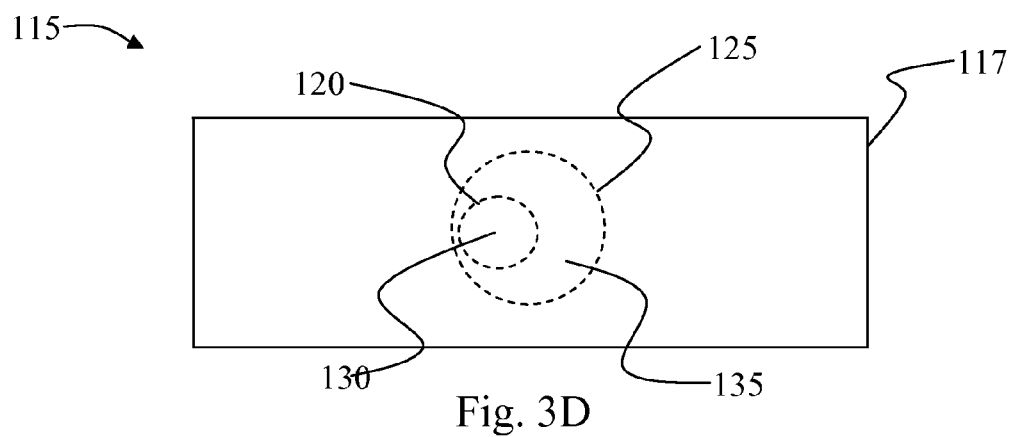
Figure 3E:
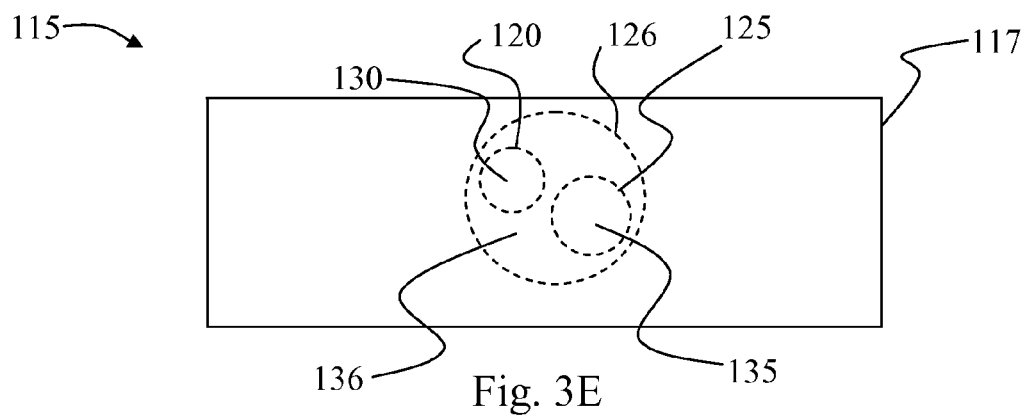

In the embodiments of FIGS. 3A and 3B, conduits 120 and 125 are physically displaced from each other and the cross-sections of conduits 120 and 125 are non-overlapping. The objective of maintaining a physical separation between two or more streams containing different deposition species may also be achieved with conduits having overlapping cross-sections. Two or more conduits may, for example, be concentric with each other or one or more conduits may be otherwise housed within another conduit. FIG. 3C depicts an embodiment in which conduits 120 and 125 are concentric (co-axial) with each other within applicator 115 and FIG. 3D depicts an embodiment in which conduit 120 is housed within, but not concentric with conduit 125. In FIGS. 3C and 3D, the boundary of conduit 120 prevents intermixing of deposition species flowing in conduits 120 and 125. Deposition stream 130 is delivered to the interior of conduit 120 and deposition stream 135 is delivered to the portion of the interior of conduit 125 that is exterior to conduit 120. In the embodiment of FIG. 3C, for example, deposition stream 135 experiences a generally annular flow as it passes through applicator 115. Since the boundaries of conduits 120 and 125 transmit microwave radiation, microwave power (energy) can be transferred to each of deposition streams 130 and 135 in the embodiments of FIGS. 3C and 3D. FIG. 3E shows an embodiment in which conduits 120 and 125 are housed within conduit 126. In the embodiment of FIG. 3E, physical separation is maintained between deposition streams 130, 135, and 136 within the interior of applicator 115.

The number, size, shape, and relative positioning of two or more conduits permits control over the electromagnetic field provided by the microwave radiation. The relative intensity, for example, of the microwave field varies spatially and conduits carrying particular deposition species or precursors can be positioned in regions of high or low electromagnetic intensity. This flexibility affords a degree of control over the relative reactivity of multiple deposition precursors and assists the objective of engineering, on an atomic scale, the interaction and spatial distribution of the multiple elements that make up the thin film materials of the instant invention.

Conduits 120 and 125 are formed from a material that transmits microwave radiation. Preferably, conduits 120 and 125 are highly transparent to microwave radiation. Dielectric materials, such as oxides and nitrides, are among the dielectric materials that may be used to form conduits 120 and 125. Representative dielectric materials include $SiO_2$, quartz, $Al_2O_3$, sapphire, transition metal oxides, silicon nitride, aluminum nitride, and transition metal nitrides.

The embodiment shown in FIG. 1 includes an applicator having two conduits for delivery of streams of deposition species. In the embodiment of FIG. 1, the deposition species in the two conduits are energized or activated by a common field of microwave radiation. The instant invention extends generally to applicators including two or more conduits for delivering two or more independent streams of deposition precursors, where the independent streams are energized or activated by a common field of microwave radiation. The instant invention also includes embodiments in which two or more streams of deposition precursors are provided to two or more applicators, each of which includes one or more conduits. In these embodiments, a separate microwave generator may be used for each applicator to achieve independent control over the frequency and/or power of the field of microwave radiation used to energize or activate different streams of deposition precursors.

Figure 4:
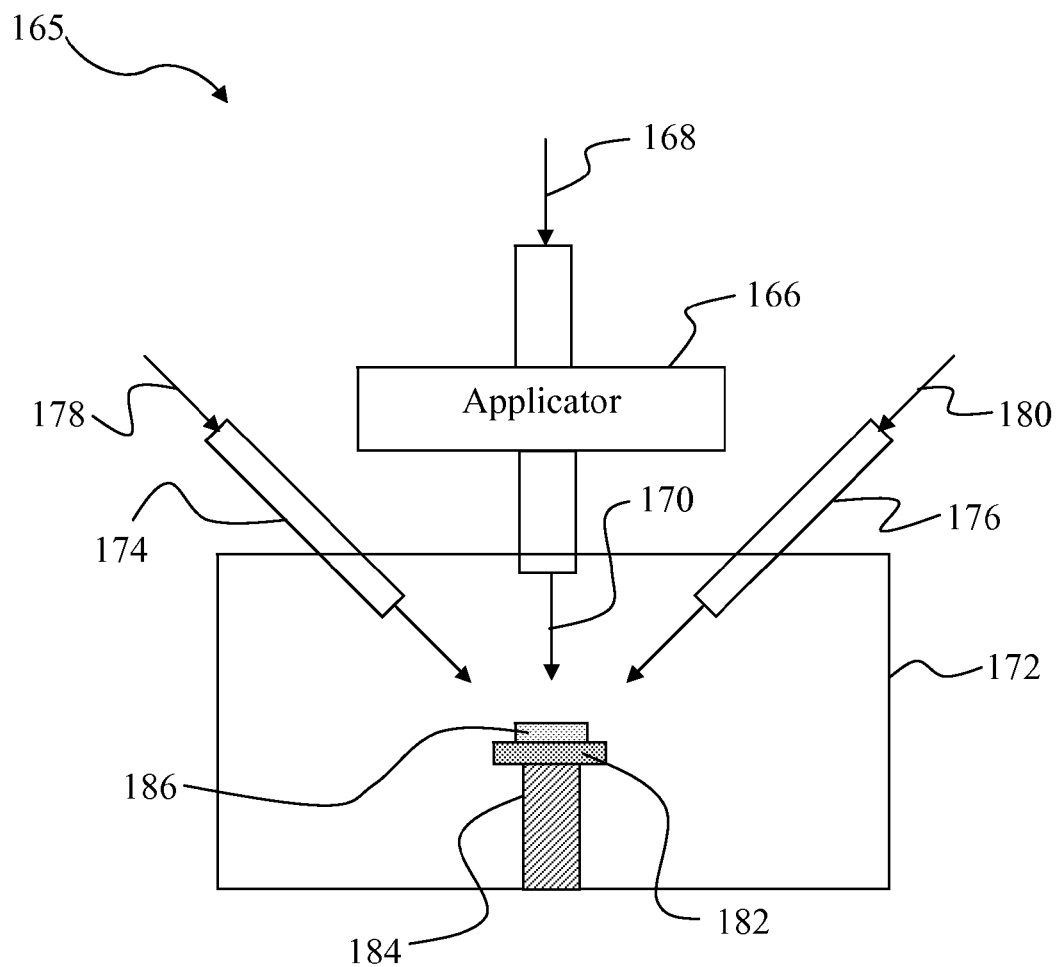
FIG. 4 depicts a system for the microwave deposition of thin film materials that includes at least one energized deposition medium stream and at least one non-energized deposition medium stream.

FIG. 4 depicts an embodiment in which supplemental material streams are directed to the deposition chamber in combination with an energized deposition medium. System 165 includes microwave applicator 166 that receives input stream 168 and energizes it with microwave radiation as described hereinabove to form energized deposition medium 170 that is delivered to deposition chamber 172. As described hereinabove, input stream 168 may include one or more components, where each component is a deposition precursor, intermediate, carrier gas, or diluent gas. System 165 further includes inlets 174 and 176 that deliver supplemental material streams 178 and 180 to deposition chamber 172. Supplemental material streams 178 and 180 may be precursors, intermediates, carrier gases, diluent gases, or background gases and are directly delivered to deposition chamber 172 without being activated or energized in microwave applicator 166. Supplemental material streams 178 and 180 combine with energized deposition medium 170 in the vicinity of substrate 182 positioned on mount 184. Supplemental material streams 178 and 180 interact, dilute, or react with energized deposition medium 170 at or on substrate 182 to form thin film material 186.

The embodiment shown in FIG. 4 depicts a deposition system that includes two supplemental material streams in combination with a microwave applicator that provides a single energized deposition medium stream. In related embodiments, the microwave applicator may provide two or more energized deposition medium streams or two or more microwave applicators, each of which provides one or more energized deposition medium streams may be employed. The number of supplemental streams may be one or more. In one embodiment, the one or more supplemental material streams are electrically neutral. In another embodiment, the one or more supplemental material streams are non-ionized. In a further embodiment, the one or more supplemental material streams are in an electronic ground state.

The deposition chamber may also include an internal energizing source to prevent or slow relaxation or decay of the energized species entering the deposition chamber from the one or more conduits of the one or more microwave applicators. As noted hereinabove, microwave excitation of material streams passing through a conduit of a microwave applicator may energize or ignite a plasma therefrom. As the energized or ignited material stream flows away from the region of microwave coupling and enters the deposition chamber, it may no longer be influenced or excited by the microwave field present in the applicator. As a result, the excited, energized, activated or ignited species in the energized deposition medium delivered to the deposition chamber may relax or decay to lower energy states. When relaxation or decay occurs, the distribution of species present may be altered and the characteristics of the ultimate thin film may be compromised due, for example, to a higher prevalence of defects or impurities. The extent of relaxation or decay depends on the separation between the substrate and point of entry of the energized deposition medium into the deposition chamber, frequency of collisions between species within the energized deposition medium and the intrinsic decay rates of the individual species present in the energized deposition medium.

In one embodiment, the supplemental energy source is an electromagnetic source that includes an antenna array. The antenna array may generate or sustain an electromagnetic field and may further provide phase control. In one embodiment, the electromagnetic field is a microwave field.

The deposition species that may be introduced into the conduits of a microwave applicator or inlets providing supplemental material streams include neutral gases, ionized gases, pre-energized gases, plasmas, or combination thereof. The instant invention provides a particular benefit for combinations of deposition species that are capable of reacting (in either an energized or non-energized state) to form a thin film material capable of absorbing microwave radiation. Deposition species generally include gas phase materials that contain silicon, germanium, tin, fluorine, and/or hydrogen. Representative deposition species include silane ($SiH_4$), disilane ($Si_2H_6$), fluorinated forms of silane ($SiF_4$, $SiF_3H$, $SiF_2H_2$, $SiFH_3$), germane ($GeH_4$), fluorinated forms of germane ($GeF_4$, $GeF_3H$, $GeF_2H_2$, $GeFH_3$), as well as ionized, energized, or activated forms thereof, and combinations thereof. Deposition species also include hydrogen gas, fluorine gas, $NF_3$ gas, and hydrogen fluoride gas, as well as carrier or background gases such as argon, helium, krypton, or neon.

Deposition species may or may not contribute an element to the intended thin film composition. A deposition species may, for example, act as a surface treatment agent that improves the quality of the deposited film. A fluorinated gas, for example, may function as a surface treatment gas to passivate defects or saturate dangling bonds at the surface of the deposited thin film material. Alternatively, a deposition species may facilitate initiation of a plasma or assist in establishing a particular deposition pressure even though it does not contribute an element to the deposited material.

Fluorinated deposition species are advantageous because fluorine promotes regular tetrahedral coordination of silicon, germanium and tin in thin film materials, relieves bond strain, acts to passivate dangling bonds and other defects that produce tail states or midgap states that compromise carrier mobility in photovoltaic materials, and assists in the formation of nanocrystalline, intermediate range order, or microcrystalline phases of silicon and germanium. (For more information see, for example, the following references by S. R. Ovshinsky: U.S. Pat. No. 5,103,284 (formation of nanocrystalline silicon from $SiH_4$ and $SiF_4$); U.S. Pat. No. 4,605,941 (showing substantial reduction in defect states in amorphous silicon prepared in presence of fluorine); and U.S. Pat. No. 4,839,312 (presents several fluorine-based precursors for the deposition of amorphous and nanocrystalline silicon); the disclosures of which are incorporated by reference herein).

Silane ($SiH_4$) has been widely used as a deposition precursor for amorphous silicon, but is known to produce material that has poor electronic properties due to the presence of a particularly high concentration of dangling and strained bonds. Deposition of amorphous silicon from silane in the presence of high hydrogen ($H_2$) dilution has been shown to improve the electronic properties of amorphous silicon. Inclusion of excess hydrogen in the deposition process has the effect of passivating dangling bonds and relieving bond strain to provide a material with a lower concentration of defects, a lower density of states, and better carrier transport properties. Hydrogen dilution provides benefits similar to fluorine, but has the drawback of promoting a time-dependent degradation of photovoltaic efficiency through the Staebler-Wronski effect when present above a certain concentration.

To date, efforts to increase the plasma deposition rate of amorphous silicon from silane (alone or in the presence of hydrogen dilution) by increasing the plasma frequency from the radiofrequency range to the microwave frequency range have been frustrated by an enhancement in the production of solid phase, particulate silanaceous byproducts that has been observed as the plasma frequency is increased. The silanaceous byproducts are thought to be long chain or polymeric compounds of silicon and hydrogen (e.g. polysilanes) and deposit throughout the deposition chamber, including on the windows used to couple microwave energy to silane and/or hydrogen. Since the silanaceous byproducts absorb microwave radiation, microwave deposition of silane under conditions of high hydrogen dilution has proved to be a commercially impractical process. In addition, the presence of silanaceous byproducts is thought to contribute to Staebler-Wronski degradation. As a result, the benefits of high hydrogen dilution have been commercially realized only in radiofrequency plasma processes to avoid production of excess hydrogen and suppress formation of silanecous byproducts and the deposition rates have been accordingly low.

In one embodiment of the instant invention, materials with properties comparable or superior to those available from a high hydrogen dilution process are realized in a high rate microwave plasma deposition process by delivering $SiF_4$ to one conduit of a microwave applicator and $H_2$ to a second conduit of the same or separate applicator. Separation of the source of silicon from the source of hydrogen enables deposition of amorphous, intermediate range order, nanocrystalline, and microcrystalline forms of silicon in a microwave plasma process. Since $SiF_4$ is free from hydrogen, its excitation or activation by microwave radiation does not lead to the production of polysilane or related byproducts. As a result, the formation of unintended silanaceous coatings on the microwave window is avoided and the severity of Staebler-Wronski degradation is significantly reduced. Similarly, microwave activation or excitation of hydrogen in the absence of silicon occurs without the production of undesirable solid phase byproducts. As a result, the distribution of species needed to form high quality silicon-based photovoltaic materials can be created in a continuous process without corrupting the microwave windows. The species may then be transported away from the region of microwave coupling and combined in the vicinity of a substrate for deposition of a thin film material.

The relative amounts of $SiF_4$ and $H_2$ may be adjusted by controlling the pressure or flow rate of each in their respective conduits or by combining either or both of $SiF_4$ and $H_2$ with a carrier or background gas. Inclusion of deposition species such as $F_2$ or HF provide further control over the relative amounts of silicon, hydrogen and fluorine present in the deposition environment established in the vicinity of the substrate. Adjustment of the relative amounts of deposition species containing silicon, germanium, hydrogen, and/or fluorine permits control over the degree of crystallinity and microstructure of the thin film material deposited on the substrate as well as control over the density of states and severity of the Staebler-Wronski effect.

In other embodiments, a fluorine-containing gas and a hydrogen-containing gas may be delivered by separate conduits of one or more microwave applicators. $SiF_4$ and $SiH_4$, for example, may be delivered by separate conduits of a microwave applicator. Similarly, $SiH_4$ and a fluorine-containing gas (e.g. $F_2$, $NF_3$, or a fluorinated germanium gas) may be delivered by separate conduits of one or more microwave applicators.

In still other embodiments, one or more of a silicon-containing gas, germanium-containing gas, fluorine-containing gas, or hydrogen-containing gas may be delivered by a microwave applicator as an energized deposition medium to a deposition chamber and others of a silicon-containing gas, germanium-containing gas, fluorine-containing gas, or hydrogen-containing gas may be delivered as non-energized supplemental material streams to the deposition chamber. For example, one or more of $SiF_4$, $SiH_4$, $H_2$, or $F_2$ may be delivered by a microwave applicator as an energized deposition medium to a deposition chamber and others of $SiF_4$, $SiH_4$, $H_2$, or $F_2$ may be delivered as non-energized supplemental material streams to the deposition chamber.

In one embodiment, $SiF_4$ is activated by microwave energy in a conduit of an applicator and delivered to a deposition equipped to provide $H_2$ as a supplemental material stream, where the $H_2$ stream has not been activated by microwave radiation. In another embodiment, $SiF_4$ is activated by microwave energy in a conduit of an applicator and delivered to a deposition equipped to provide $SiH_4$ as a supplemental material stream, where the $SiH_4$ stream has not been activated by microwave radiation. In other embodiment, fluorine is provided both in a supplemental, non-energized material stream and as a microwave-energized material stream from an applicator. The supplemental fluorine stream may include $F_2$ or HF diluted by a carrier gas such as a noble gas.

The instant invention further contemplates delivery of precursors in separate streams that are activated by electromagnetic radiation at different frequencies. As noted hereinabove, microwave activation of silane is believed to produce materials with a particularly pronounced degree of Staebler-Wronski degradation because of the high concentration of active hydrogen released from silane. A lesser degree of active hydrogen is formed, however, upon excitation of silane by a radiofrequency electromagnetic field. In one embodiment of the instant invention, the deposition process includes microwave activation of $SiF_4$ and radiofrequency activation of silane. Radiofrequency activation of silane provides a controlled source of hydrogen that allows for management of the hydrogen-to-fluorine ratio in the deposition environment.

The structural and compositional control afforded by the instant invention further provides silicon-containing semiconductors, including amorphous semiconductors, that exhibit little or no Staebler-Wronski degradation. One of the drawbacks associated with utilizing high hydrogen dilution in forming amorphous silicon is a degradation of photovoltaic efficiency over time known as the Staebler-Wronski effect. Although high hydrogen dilution conditions form amorphous silicon materials with improved photovoltaic efficiency, the effect is not permanent and photovoltaic efficiency gradually decays over time with persistent exposure to solar energy. The origin of the Staebler-Wronski effect is not fully understood, but is believed to involve a photogeneration of electronic defect states or carrier trapping centers by incident sunlight. The degradation effect has been observed to become more severe as the extent of hydrogen dilution increases.

A pronounced Staebler-Wronski effect is one reason why attempts in the prior art to prepare amorphous silicon in a microwave deposition process have been unsuccessful. Although microwave conditions have provided high deposition rates in the prior art, the resulting amorphous silicon material has suffered from an unacceptably high degree of Staebler-Wronski degradation. It is believed that the more energetic conditions associated with microwave plasmas (relative to radiofrequency plasmas) releases too much hydrogen from the silane ($SiH_4$) precursor to provide an especially high degree of hydrogen dilution and an especially severe Staebler-Wronski effect.

The instant inventor believes that inclusion of fluorine in the composition of silicon-containing amorphous semiconductors can remedy the Staebler-Wronski effect by strengthening bonds and improving the structural integrity of the material to render it less susceptible to light-induced defect creation. The instant inventor recognizes, however, that direct inclusion of fluorine in a prior art plasma deposition process (at microwave or radiofrequency frequencies) leads to a further complication. Specifically, microwave activation of a fluorine-containing precursor leads to release of a high concentration of fluorine, which can, in turn, promote deterioration of the structure of the thin film product through etching. Etching creates pores in the thin film product and leads to a low density material having a high internal surface area. The high surface area includes a high concentration of surface defect states that detract from photovoltaic efficiency by promoting non-radiative recombination processes. The high surface area is also reactive and promotes contamination of the material with environmental agents such as oxygen or nitrogen.

Management of the presence of fluorine provides a strategy for minimizing the tendency of fluorine to etch the product film. The presence of fluorine can be managed by controlling the timing of fluorine introduction, the concentration of fluorine, and the form of fluorine in the deposition environment. Hydrogen, for example, is one tool for controlling the form of fluorine because the simultaneous presence of hydrogen and fluorine depletes the supply of active, dissociated fluorine through the formation of HF. By binding fluorine with hydrogen, the overall supply of active fluorine can be regulated and controlled to provide enough fluorine to promote favorable bonding configurations within the product thin film while avoiding etching to facilitate formation of a dense, non-porous product film at high deposition rates.

Example 1

In this example, selected compositional and optical absorption characteristics of representative thin film materials comprising amorphous silicon in accordance with the instant invention are described. The materials are denominated Sample 547 and Sample 548 and were prepared in a deposition system similar to that shown in FIG. 4 that included a single microwave applicator with a single conduit passing therethrough and a single supplemental inlet for delivering a non-energized supplemental material stream. The conduit was made from sapphire and the substrate was positioned about 4 inches from the interface of the conduit with the deposition chamber. A mixture of 1 standard liter per minute of $SiF_4$ and 2 standard liters per minute of argon was introduced to the conduit of the microwave applicator and activated with microwave radiation at a frequency of 2.45 GHz and a power of 600 W. $SiH_4$ was introduced at a rate of 1 standard liter per minute to the deposition chamber through the supplemental delivery port in an electrically-neutral state. The energized stream exiting the conduit of the microwave applicator and the non-energized stream supplied by the supplemental delivery port were directed to a substrate and a thin film product material was formed therefrom. The substrate was maintained at a temperature of about 400° C. and positioned on a mount. An electrical bias could be optionally provided to the mount. For Sample 547, the substrate bias was maintained at ground and for Sample 548, the substrate was AC-biased at 100 kHz with a 60V peak-to-peak biasing signal. The deposition rate of Samples 547 and 548 was ~140 Å/s.

Figure 5:
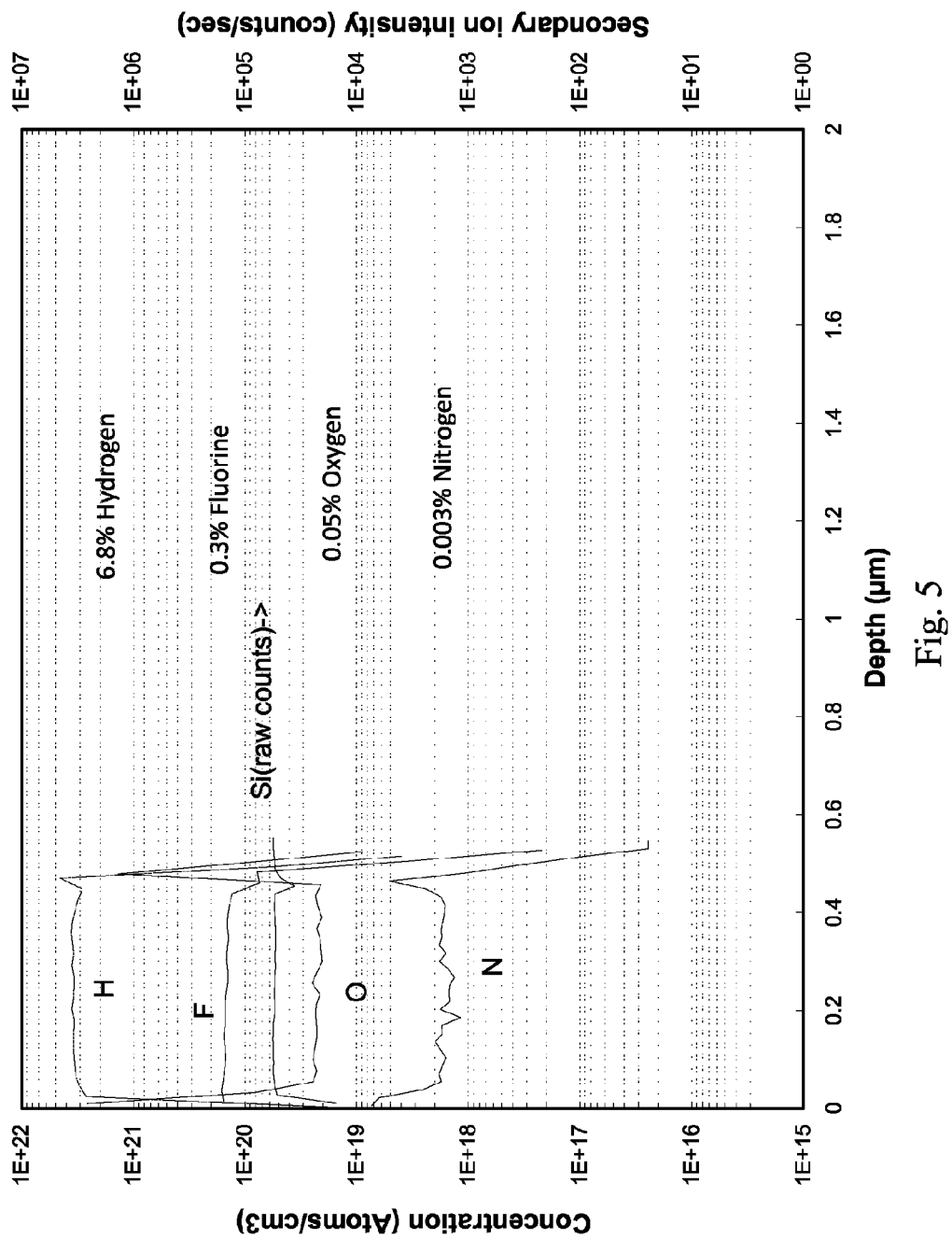
FIG. 5 presents a compositional analysis of a silicon-containing photovoltaic material in accordance with the instant invention.
Figure 6:
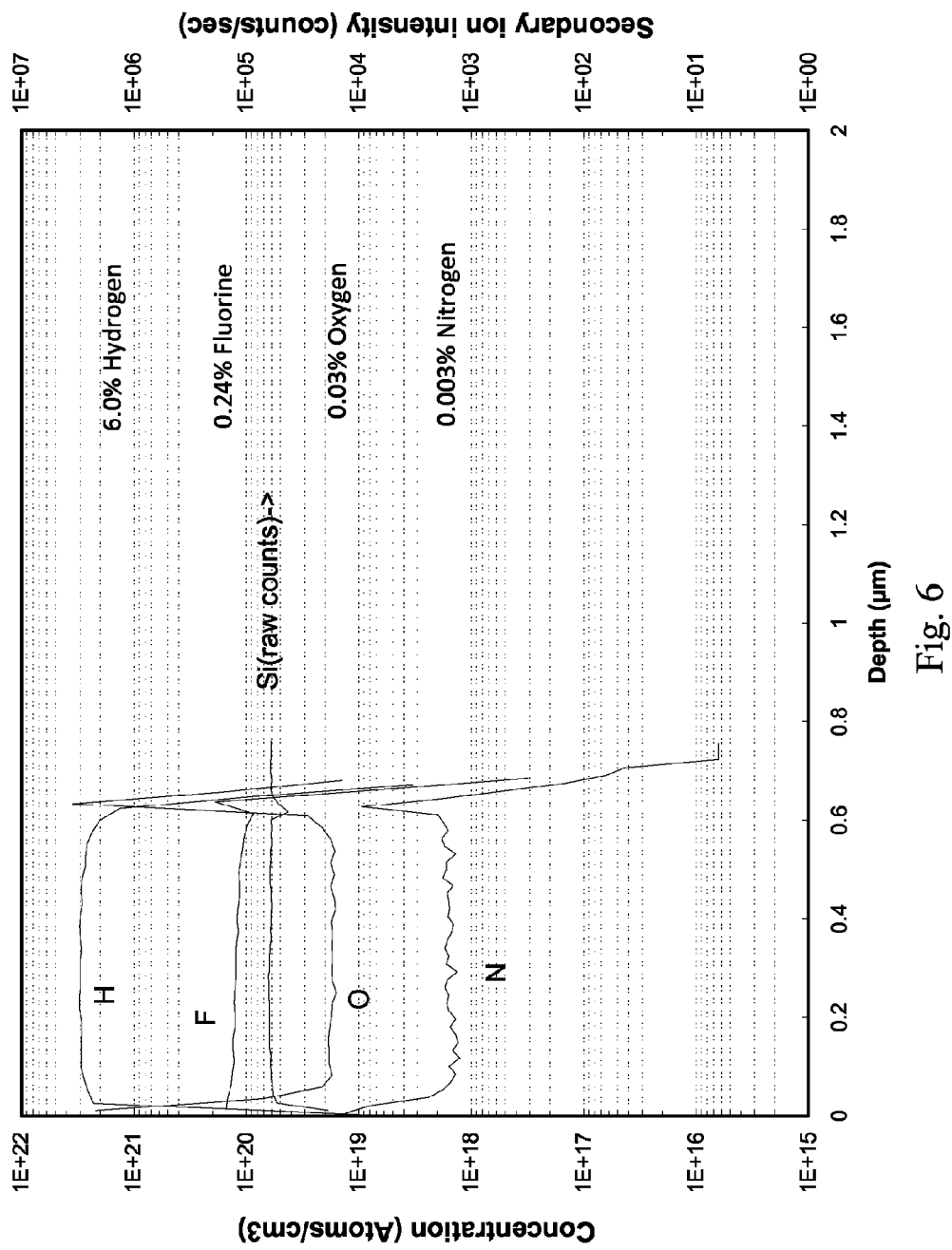
FIG. 6 presents a compositional analysis of a silicon-containing photovoltaic material in accordance with the instant invention.

FIGS. 5 and 6 show the results of a SIMS (secondary ion mass spectrometry) analysis of the chemical composition of Samples 547 and 548, respectively. The SIMS profile is a measure of the concentration of different elements in the composition as a function of depth within the sample. FIG. 5 indicates that the composition of Sample 547 was primarily silicon and also included 6.8% hydrogen, 0.3% fluorine, 0.05% oxygen, and 0.0003% nitrogen. FIG. 6 indicates that the composition of Sample 548 was primarily silicon and also included 6.0% hydrogen, 0.24% fluorine, 0.03% oxygen, and 0.0003% nitrogen. The low level of oxygen in Samples 547 and 548 indicates that both materials are free from atmospheric contamination.

Figure 7:
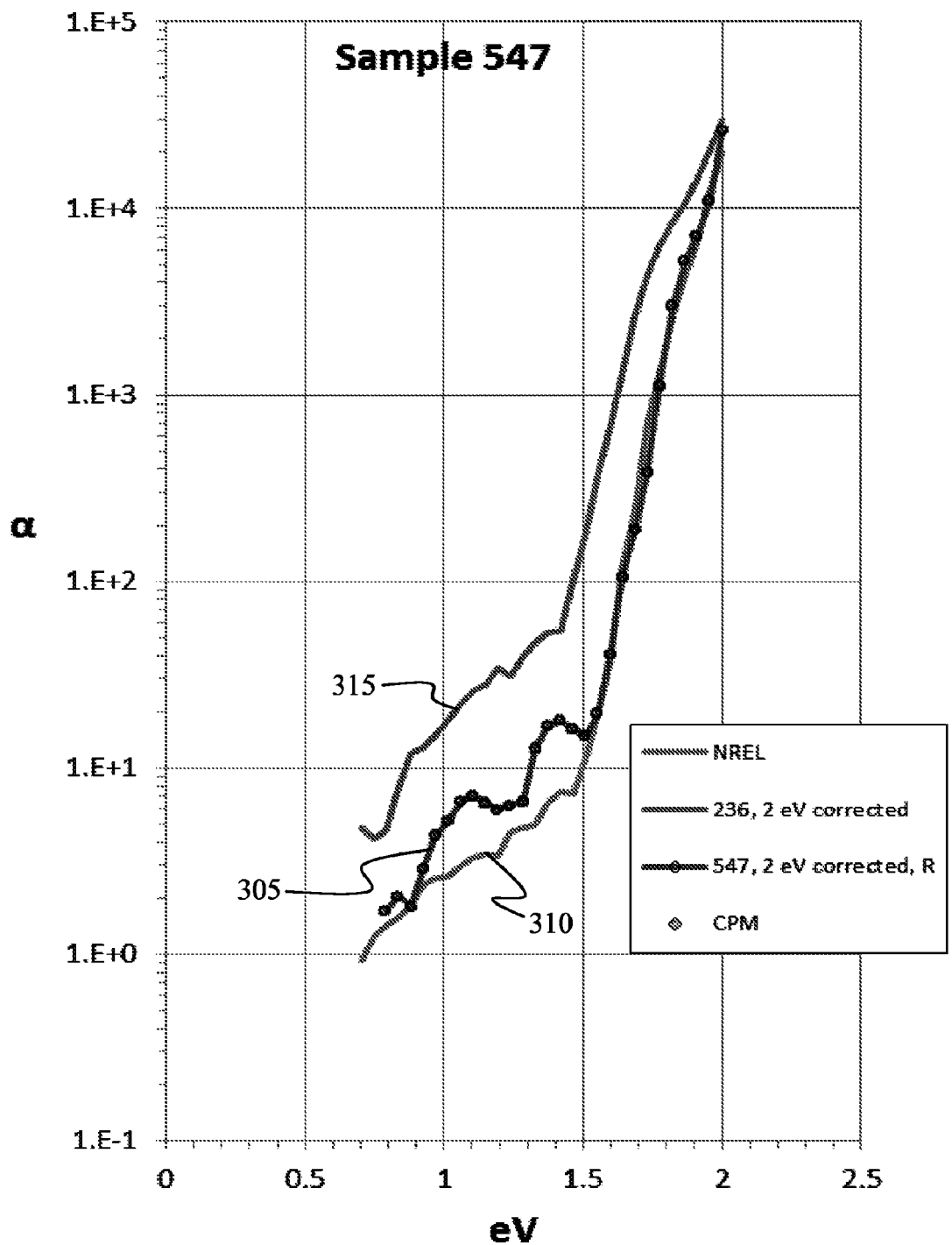
FIG. 7 shows the optical absorption spectrum of the silicon-containing photovoltaic material with the composition depicted in FIG. 5.
Figure 8:
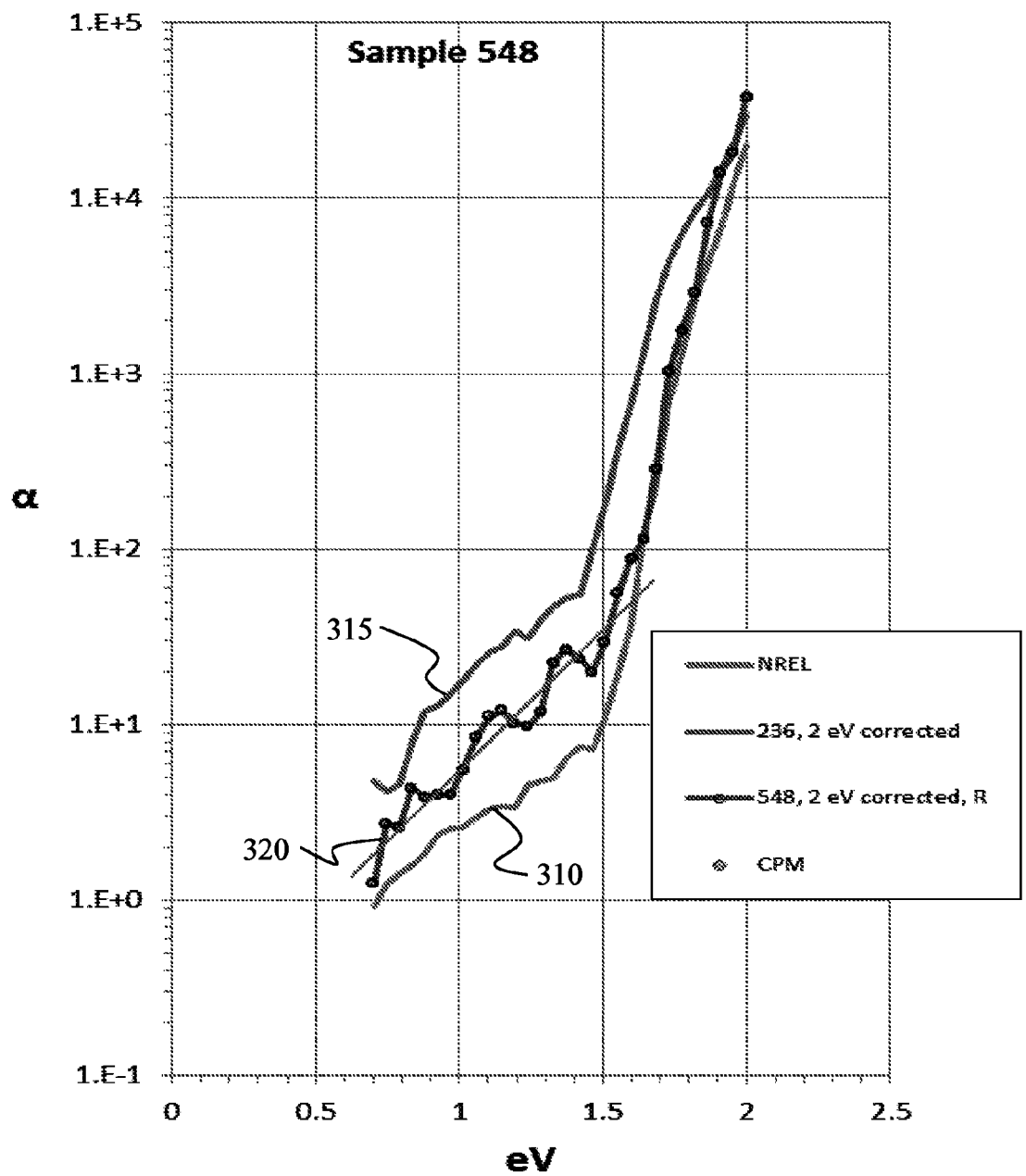
FIG. 8 shows optical absorption spectrum of the silicon-containing photovoltaic material with the composition depicted in FIG. 6.

FIGS. 7 and 8 show the optical absorption spectra of Samples 547 and 548, respectively, and provide comparisons with the optical absorption spectra of two reference materials. The figures show the dependence of the absorption coefficient α as a function of photon energy (expressed in units of eV).

In FIG. 7, trace 305 corresponds to the optical absorption spectrum of Sample 547. Trace 310 (labeled "NREL" and corresponding to comparative Sample NREL) shows the optical absorption spectrum of a high quality reference sample of amorphous silicon prepared by a slow rate prior art deposition process. Sample NREL was non-fluorinated and corresponds to the current state of the art for thin film amorphous silicon materials. Trace 315 (labeled "236" and corresponding to comparative Sample 236) shows the optical absorption spectrum of a low quality reference sample of fluorinated amorphous silicon prepared by a high deposition rate process. Trace 310 for Sample NREL and trace 315 for comparative Sample 236 are repeated in FIG. 8. FIG. 8 further includes trace 320 for Sample 548.

Characterization of comparative Sample 236 indicated that the material was porous with a pore volume fraction of ~10% based on refractive index measurements. SIMS data indicated that comparative Sample 236 had a composition that included 2.8% hydrogen, 0.15% fluorine, 0.34% oxygen, and 0.0032% nitrogen. The much higher oxygen concentration for comparative Sample 236 relative to Samples 547 and 548 is consistent with its high porosity and greater susceptibility of environmental contamination.

Comparative Sample NREL, comparative Sample 236, Sample 547, and Sample 548 all exhibited a pronounced increase in optical absorption at a photon energy of about 1.5 eV. The sharp increase in absorption coefficient represents the onset of the transition from the valence band to the conduction band for each of the samples and the similarity of the photon energy at which the transition occurs in each of the materials indicates that the materials have similar bandgaps. The energy of the bandgap indicates that Samples 547 and 548 are predominantly amorphous phase materials.

The optical absorption spectrum of a semiconductor material at energies below the bandgap provides a measure of the quality of the material. In the absence of defects (structural, electronic, or compositional), a semiconductor material should exhibit no absorption at energies below the bandgap. When defects are present, however, electronic states can form in the bandgap. These states can participate in optical transitions between each other or with either or both of the valence band and conduction band to provide optical absorption features at energies below the bandgap energy. The presence of midgap defects states is undesirable from a performance perspective because they typically serve as recombination or trapping centers that reduce photovoltaic efficiency. The intensity of optical absorption in the below bandgap portion of the spectrum is a measure of the density of defect states in the bandgap. Low optical absorption at below bandgap energies signifies a low density of defect states and a higher quality product material.

A comparison of the optical absorption spectra shown in FIGS. 7 and 8 indicates that comparative Sample NREL shows only weak absorption in the below bandgap spectral region (photon energies of less than ~1.5 eV), while comparative Sample 236 exhibits pronounced absorption in the below bandgap spectral region. These results indicate that comparative Sample NREL has a low concentration of defect states, while comparative Sample 236 includes a high concentration of defect states.

The results show that Samples 547 and 548 exhibit significantly less absorption in the below bandgap spectral region than comparative Sample 236. This is an indication that Samples 547 and 548 possess a much lower concentration of defects and a much lower density of states than comparative Sample 236. The defect concentrations and density of states of Samples 547 and 548 are only slightly greater than that of comparative Sample NREL.

The results indicate that the instant invention provides a silicon-containing amorphous semiconductor material at high deposition rate that has a defect concentration comparable to the state of the art found in low deposition rate amorphous silicon. Relative to other high deposition rate processes, the instant invention provides a denser, less porous material that has a much lower concentration of midgap defects.

Figure 9:
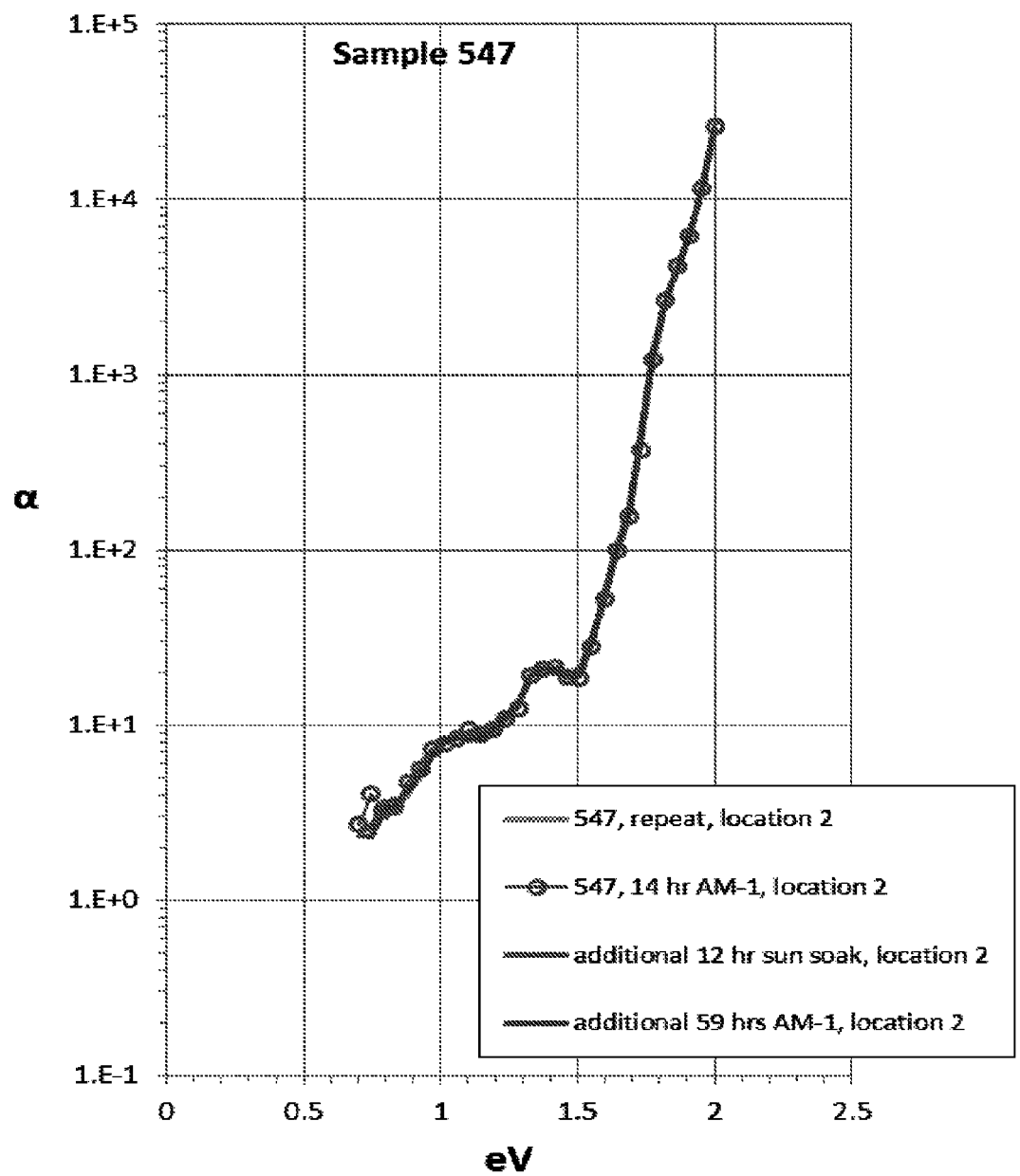
FIG. 9 shows the evolution of the optical absorption spectrum of the silicon-containing photovoltaic material with the composition depicted in FIG. 5 upon exposure to solar radiation.

FIG. 9 shows the evolution of the optical absorption spectrum of Sample 547 with time upon continuous exposure to incident electromagnetic radiation. The optical absorption spectrum of Sample 547 at a particular location was measured before exposure to incident radiation. Sample 547 was then subjected to continuous exposure to incident radiation and the optical absorption spectrum at the same location was measured at various times. Sample 547 was first exposed to radiation that simulates the solar spectrum (AM-1) for 14 hours and the optical absorption spectrum was measured. Sample 547 was next exposed to the sun for an additional 12 hours and the optical absorption spectrum was measured again. Finally, Sample 547 was exposed to the AM-1 simulated solar spectrum for a further 59 hours (for a total 85-hour exposure time) and the optical absorption spectrum was measured again. FIG. 9 presents the results of the measurements and shows that the optical absorption spectrum of Sample 547 was virtually unchanged upon exposure to incident radiation. Constancy of the optical absorption spectrum indicates that density of states of Sample 547 did not increase during the period of exposure and demonstrates that Sample 547 is essentially free from degradation due to the Staebler-Wronski effect.

In one embodiment, the thin film material of the instant invention is free from Staebler-Wronski degradation after exposure to the solar spectrum for at least 14 hours. In another embodiment, the thin film material of the instant invention is free from Staebler-Wronski degradation after exposure to the solar spectrum for at least 26 hours. In a further embodiment, the thin film material of the instant invention is free from Staebler-Wronski degradation after exposure to the solar spectrum for at least 85 hours.

Figure 10:
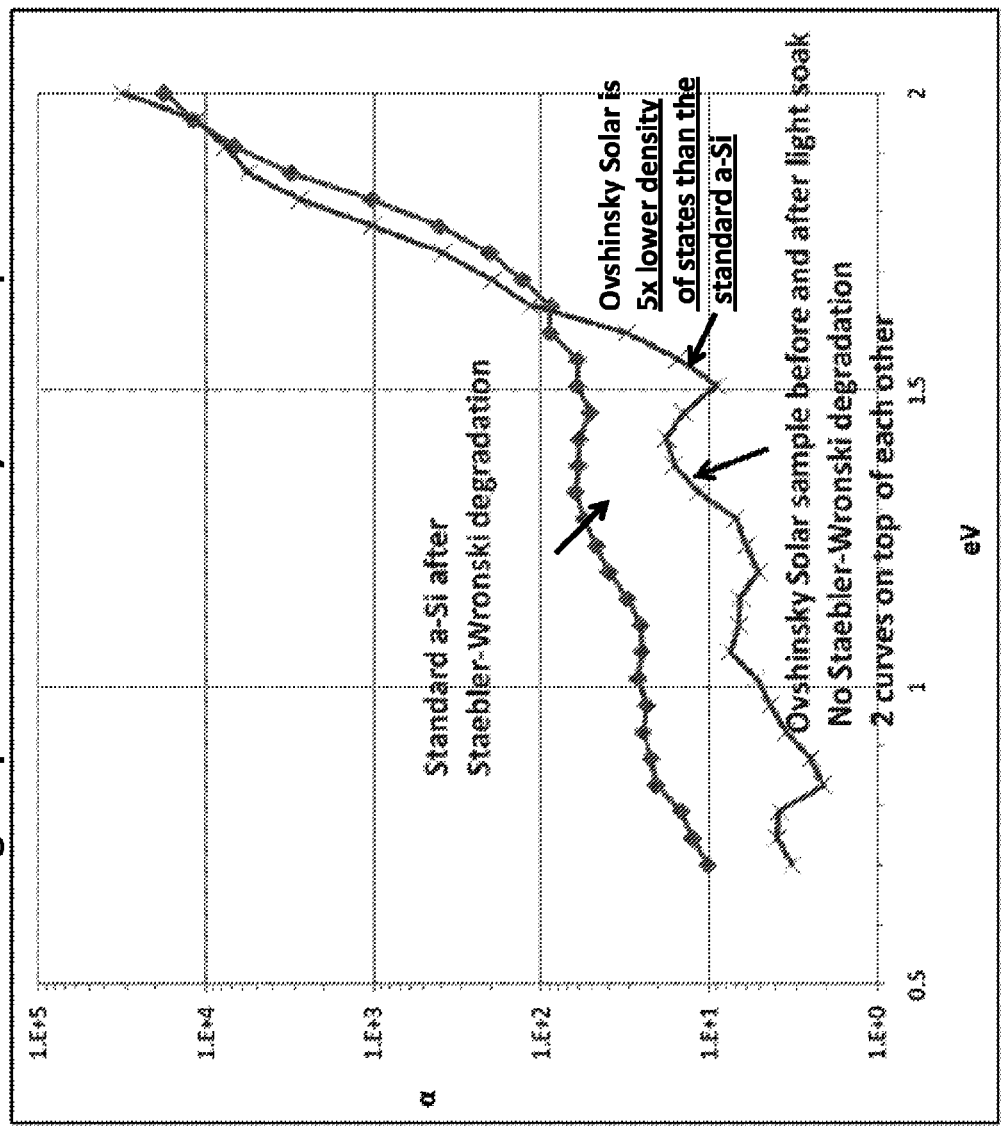
FIG. 10 compares the effect of solar radiation on conventional amorphous silicon and an amorphous silicon material in accordance with the instant invention.

FIG. 10 compares the effect of solar radiation on Sample 547 with the effect of solar radiation on the NREL sample of conventional sample of amorphous silicon referred to in FIG. 7. Sample 547 is referred to as the "Ovshinsky Solar" sample and the NREL sample is referred to as "Standard a-Si" in FIG. 10. As indicated in FIG. 9, Sample 547 exhibited little or no Staebler-Wronski degradation. The sample of conventional amorphous silicon, however, exhibited pronounced degradation upon exposure to solar radiation. Before exposure to solar radiation, Sample 547 exhibited slightly greater absorption at below bandgap energies than conventional amorphous silicon (See FIG. 7). The density of states in the bandgap for Sample 547 was therefore slightly higher than the density of states in the bandgap for conventional amorphous silicon before exposure to solar radiation. After exposure to solar radiation, however, conventional amorphous silicon exhibited significantly greater absorption at below bandgap energies than Sample 547. Based on the data shown in FIG. 10, it is estimated that the density of states in Sample 547 after exposure to solar radiation is less by a factor of five than the density of states in conventional amorphous silicon. Unlike conventional amorphous silicon, materials prepared in accordance with the instant invention exhibit stable optical properties without photogeneration of midgap or near edge defect states when exposed to solar radiation. Convention amorphous silicon, in contrast, exhibits appreciable Staebler-Wronski degradation.

The higher density of states resulting from the photodegradation of conventional amorphous silicon affects not only optical properties, but also electrical properties. The higher density of defect states in conventional amorphous silicon function as carrier traps that reduce carrier mobility and conductivity. Mobility and conductivity of materials prepared in accordance with the instant invention remain stable upon exposure to electromagnetic radiation. The low density of states and superior electrical properties of the instant materials indicate that the instant materials have utility beyond photovoltaics into a broader array of electronic applications. The instant materials, for example, provide excellent prospects for transistors and diodes based on amorphous silicon. The instant invention motivates a true silicon-based thin film electronics technology.

This example demonstrates the remarkable result that a silicon-containing photovoltaic material that exhibits a low density of states and essentially no Staebler-Wronski degradation can be deposited at a rate ~140 Å/s.

Example 2

In this example, the effect of process gas ratio on the deposition rate and photoconductivity of representative materials comprising amorphous silicon in accordance with the instant invention is described. The samples were prepared using the deposition system described in Example 1 hereinabove. A mixture of 1 standard liter per minute of $SiF_4$ and 2 standard liters per minute of argon was introduced to the conduit of the microwave applicator and activated with microwave radiation at a frequency of 2.45 GHz and a power of 600 W. Instead of $SiH_4$, however, disilane ($Si_2H_6$) was introduced to the deposition chamber through the supplemental delivery port and delivered as an electrically-neutral material stream. The flow rate of disilane was systematically adjusted to provide a series of samples for which the ratio of the flow rate of disilane to the ratio of the flow rate of $SiF_4$ ranged from 0.3 to 2.0. The energized stream of $SiF_4$ and argon exiting the conduit of the microwave applicator and the non-energized stream of disilane supplied by the supplemental delivery port were directed to a substrate and a thin film product material was formed therefrom. The substrate was maintained at a temperature of 400° C. and positioned on a grounded mount.

The bandgap, deposition rate, and $\mu\tau$ product were measured for each sample. The bandgap generally increased with increasing $Si_2H_6/SiF_4$ flow rate ratio and varied from 1.59 eV at a flow rate ratio of 0.3 to 1.64 eV at a flow rate ratio of 2.0μ and τ correspond to carrier mobility and carrier lifetime, respectively, upon photoexcitation at a particular wavelength. The $\mu\tau$ product was measured at two above bandgap wavelengths: 565 nm and 660 nm. The $\mu\tau$ product correlates with the photoconductivity of each sample. A higher value for the $\mu\tau$ product indicates better photoconductivity and a higher quality material. Deposition rate was determined from the thickness of the deposited material and the time of deposition.

Figure 11:
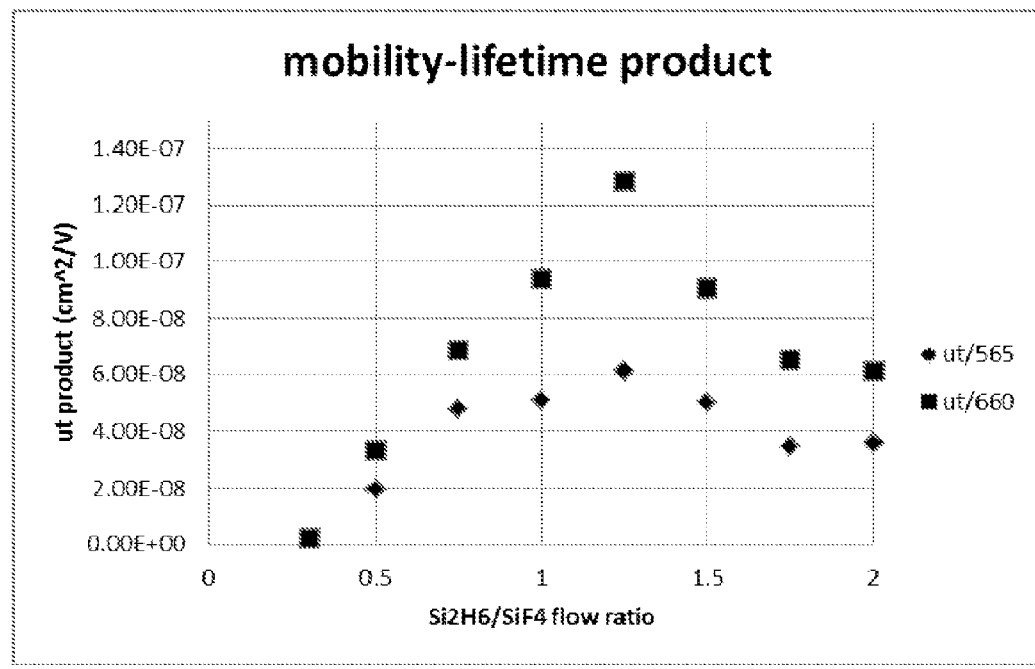
FIG. 11 shows the dependence of the μτ product on the ratio $Si_2H_6/SiF_4$ for a series of samples.

FIG. 11 shows the variation of the $\mu\tau$ product as a function of the $Si_2H_6/SiF_4$ flow rate ratio. The $\mu\tau$ product is expressed in units of $cm^2/V$. The results indicate that the $\mu\tau$ product was higher upon excitation at 660 nm than upon excitation at 565 nm, but that the $\mu\tau$ product at both excitation wavelengths was maximized at a $Si_2H_6/SiF_4$ flow rate ratio of about 1.25.

Figure 12:
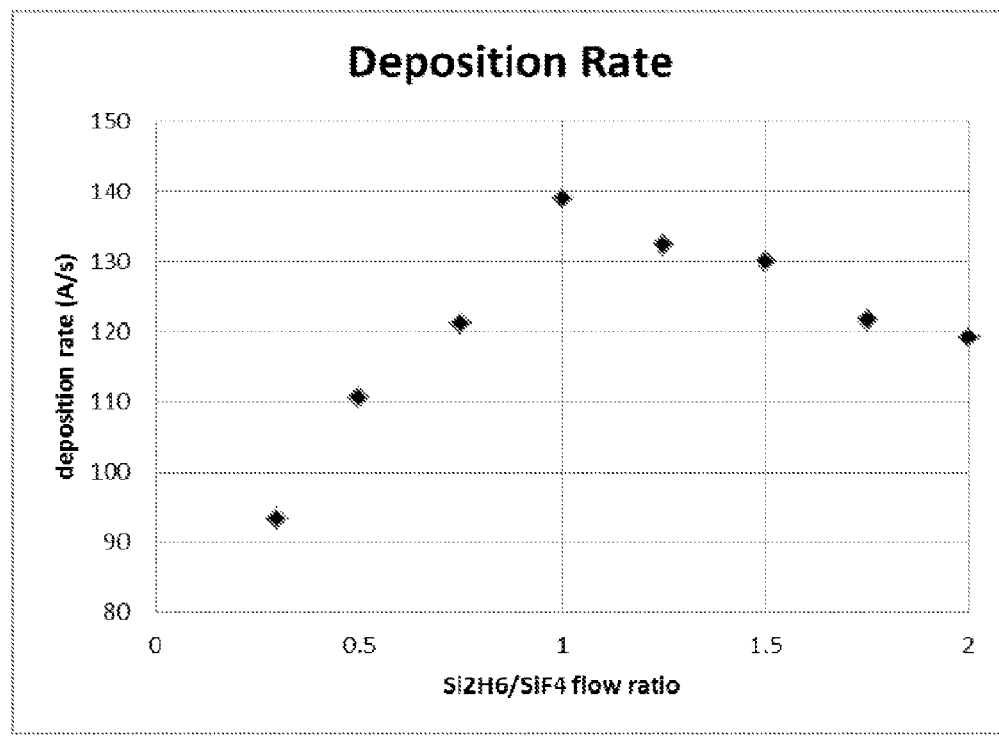
FIG. 12 shows the dependence of deposition rate on the ratio $Si_2H_6/SiF_4$ for a series of samples.

FIG. 12 shows the variation of deposition rate with the $Si_2H_6/SiF_4$ flow rate ratio. The deposition rate increased from 93 Å/s at a $Si_2H_6/SiF_4$ flow rate ratio of 0.3, peaked at 139 Å/s at a $Si_2H_6/SiF_4$ flow rate ratio of 1.0 and gradually declined at $Si_2H_6/SiF_4$ flow rate ratios above 1.0.

The data show that the highest values of the $\mu\tau$ product and the highest deposition rates both occurred over the range of $Si_2H_6/SiF_4$ flow rate ratio between 1.0 and 1.5. This example therefore demonstrates that the highest quality samples are formed at the highest deposition rates.

Example 3

In this example, the effect of substrate temperature on the deposition rate and photoconductivity of representative materials comprising amorphous silicon in accordance with the instant invention is described. The samples were prepared using the deposition system described in Example 1 hereinabove. A mixture of 1 standard liter per minute of $SiF_4$ and 2 standard liters per minute of argon was introduced to the conduit of the microwave applicator and activated with microwave radiation at a frequency of 2.45 GHz and a power of 600 W. Instead of $SiH_4$, however, disilane ($Si_2H_6$) was introduced at a rate of 1 standard liter per minute to the deposition chamber through the supplemental delivery port. The disilane was delivered in an electrically-neutral state. The $Si_2H_6/SiF_4$ flow rate ratio was fixed at 1.0 in these experiments. The energized stream of $SiF_4$ and argon exiting the conduit of the microwave applicator and the non-energized stream of disilane supplied by the supplemental delivery port were directed to a substrate and a thin film product material was formed therefrom. The substrate was placed on a grounded mount. A series of samples was prepared for which the substrate temperature was varied between 300° C. and 495° C.

The bandgap, deposition rate, and $\mu\tau$ product were measured as described in Example 2 hereinabove as a function of substrate temperature. The bandgap was 1.78 eV at a substrate temperature of 300° C. and decreased in an approximately linear manner to 1.52 eV at a substrate temperature of 495° C. The deposition rate was relatively constant, but showed a slight decrease from about 150 Å/s for substrate temperatures of 375° C. or less to about 135-140 Å/s for substrates temperatures of 400° C. or higher.

Figure 13:
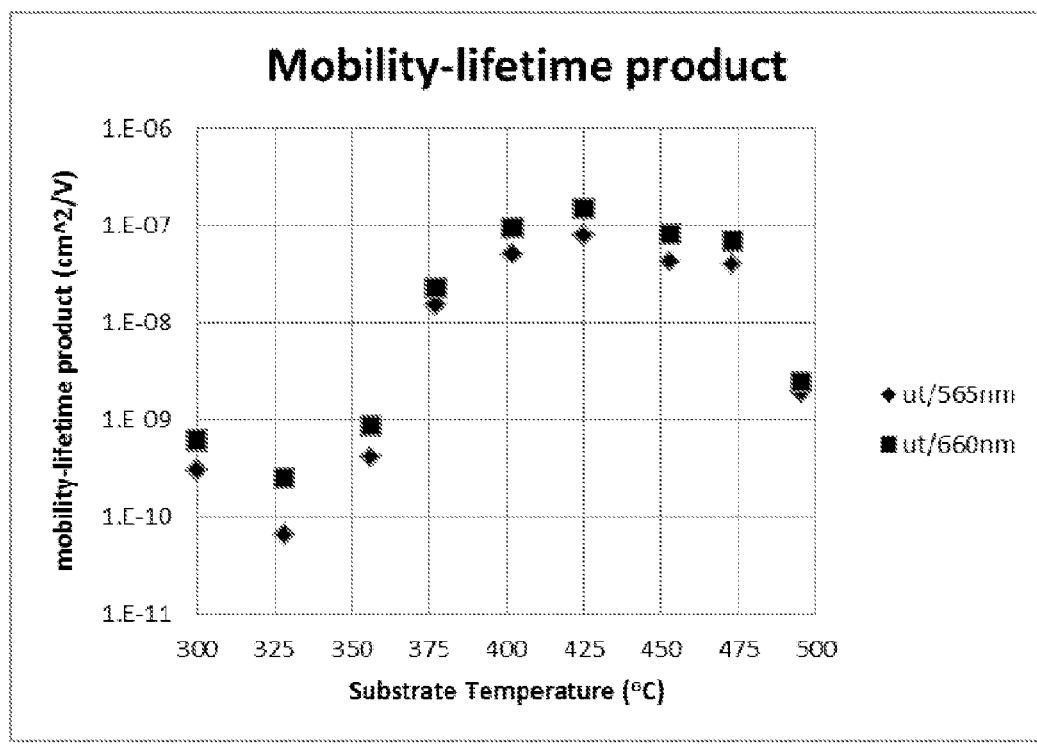
FIG. 13 shows the dependence of the μτ product on substrate temperature at a fixed $Si_2H_6/SiF_4$ ratio for a series of samples.

The variation of the $\mu\tau$ product as a function of substrate temperature is shown in FIG. 13. The $\mu\tau$ product was measured using excitation wavelengths of 565 nm and 660 nm. The data indicate that the $\mu\tau$ product was highest for substrate temperatures between 375° C. and 475° C. and was lower for substrate temperatures above and below this range.

The index of refraction was also measured for this series of samples and showed a progressive increase with increasing substrate temperature from 3.02 at a substrate temperature of 300° C. to 3.59 at a substrate temperature of 495° C. The refractive index was above 3.5 for substrates at or above 425° C. The results indicate that the samples became increasingly dense and non-porous as the substrate temperature was increased. For comparison purposes, the refractive index of fully densified amorphous silicon is about 3.6.

This example shows that the optimum substrate temperature for depositing a silicon-containing photovoltaic material from $Si_2H_6$ and $SiF_4$ at a flow rate ratio of 1.0 is between 375° C. and 475° C. The results show that high quality samples (as judged by the $\mu\tau$ product and refractive index) can be prepared at extremely high deposition rates using the principles of atomic engineering annunciated herein.

The foregoing discussion demonstrates that the instant invention permits simultaneous realization of the benefits of hydrogen and fluorine. As noted hereinabove, both hydrogen and fluorine passivate dangling bonds and relieve bond strain. Since the bond strengths of hydrogen and fluorine with silicon differ, however, hydrogen and fluorine may exhibit a preferential effectiveness for remediating energetically distinct defects within the spectrum of defects known to exist in the various structural forms of silicon (amorphous, intermediate range order, nanocrystalline, and microcrystalline). As a result, material of particularly high quality can be expected through the combined effects of fluorine and hydrogen. With this invention, such material can be formed continuously at high deposition rates in a microwave plasma deposition process for the first time and unique bonding configurations can be achieved that minimize the density of states and suppress the Staebler-Wronski effect through careful control of the relative amounts of hydrogen and fluorine.

One objective is to maximize the amount of fluorine in the product material, but to do so from a deposition environment in which the concentration of active fluorine remains below the threshold concentration at which etching occurs. Fluorine in excess of the threshold concentration may be present in the deposition environment provided it is inactive. The presence of inactive fluorine is advantageous because it can be converted to active fluorine through, for example, a supplemental energy source in the deposition chamber as described hereinabove to serve as a local source of active fluorine to compensate for the depletion of fluorine in the deposition environment as it becomes incorporated into the product film.

In one embodiment, the concentration of fluorine in a silicon-containing photovoltaic material is between 0.1% and 7%. In another embodiment, the concentration of fluorine in a silicon-containing photovoltaic material is between 0.2% and 5%. In a further embodiment, the concentration of fluorine in a silicon-containing photovoltaic material is between 0.5% and 4%. In one embodiment, the concentration of fluorine is as indicated above and the concentration of hydrogen is less than 15%. In another embodiment, the concentration of fluorine is as indicated above and the concentration of hydrogen is less than 10%. In a further embodiment, the concentration of fluorine is as indicated above and the concentration of hydrogen is less than 7%.

Deposition species may also include precursors designed to achieve n-type or p-type doping. Doping precursors include gas phase compounds of boron (e.g. boranes, organoboranes, fluoroboranes), phosphorous (e.g. phosphine, organophosphines, or fluorophosphines), arsenic (e.g. arsine or organoarsines), and $SF_6$. One or more deposition or doping precursors may be introduced to one or more conduits individually, sequentially, or in combination.

The instant microwave deposition apparatus and method may be used to form amorphous, nanocrystalline, microcrystalline, or polycrystalline materials, or combinations thereof as a single layer or in a multiple layer structure. In one embodiment, the instant deposition apparatus includes a plurality of deposition chambers, where at least one of the deposition chambers is equipped with a remote plasma source having the capabilities described hereinabove. The different chambers may form materials of different composition, different doping, and/or different crystallographic form (amorphous, nanocrystalline, microcrystalline, or polycrystalline).

The instant deposition process provides thin film materials having compositions within the scope of the instant invention at high deposition rates with a low density of defect states and little or no Staebler-Wronski effect. In one embodiment, the thin film deposition rate is at least 20 Å/s. In another embodiment, the thin film deposition rate is at least 50 Å/s. In still another embodiment, the thin film deposition rate is at least 100 Å/s. In a further embodiment, the thin film deposition rate is at least 150 Å/s. In one embodiment, thin film materials formed at the foregoing deposition rates exhibit essentially no Staebler-Wronski degradation after exposure to an AM-1 solar spectrum for at least 14 hours. In another embodiment, thin film materials formed at the foregoing deposition rates exhibit essentially no Staebler-Wronski degradation after exposure to an AM-1 solar spectrum for at least 26 hours. In still another embodiment, thin film materials formed at the foregoing deposition rates exhibit essentially no Staebler-Wronski degradation after exposure to an AM-1 solar spectrum for at least 85 hours.

In one embodiment, the temperature of the substrate is between 300° C. and 500° C. In another embodiment, the temperature of the substrate is between 325° C. and 475° C. In one embodiment, the temperature of the substrate is between 350° C. and 450° C.

In one embodiment, the substrate is electrically grounded. In another embodiment, the substrate is electrically biased. In a further embodiment, the electrical bias is an AC bias.

In one embodiment, the molar or volumetric flow rate of disilane to $SiF_4$ is between 0.3 and 2.0. In another embodiment, the molar or volumetric flow rate of disilane to $SiF_4$ is between 0.5 and 1.75. In still another embodiment, the molar or volumetric flow rate of disilane to $SiF_4$ is between 0.75 and 1.5. Since disilane includes 2 moles of silicon per mole of precursor, the flow rate ratios will be doubled when using silane as a precursor in conjunction with $SiF_4$. In one embodiment, the molar or volumetric flow rate of silane to $SiF_4$ is between 0.6 and 4.0. In another embodiment, the molar or volumetric flow rate of silane to $SiF_4$ is between 1.0 and 3.5. In still another embodiment, the molar or volumetric flow rate of disilane to $SiF_4$ is between 1.5 and 3.0.

The instant deposition apparatus is adapted to deposit one or more thin film materials on a continuous web or other moving substrate. In one embodiment, a continuous web substrate or other moving substrate is advanced through each of a plurality of deposition chambers and a sequence of layers is formed on the moving substrate. The individual deposition chambers within the plurality are operatively interconnected and environmentally protected to prevent intermixing of the deposition species introduced into the individual chambers. Gas gates, for example, may be placed between the chambers to prevent intermixing. A variety of multiple layer or stacked cell device configurations may be obtained.

Figure 14:
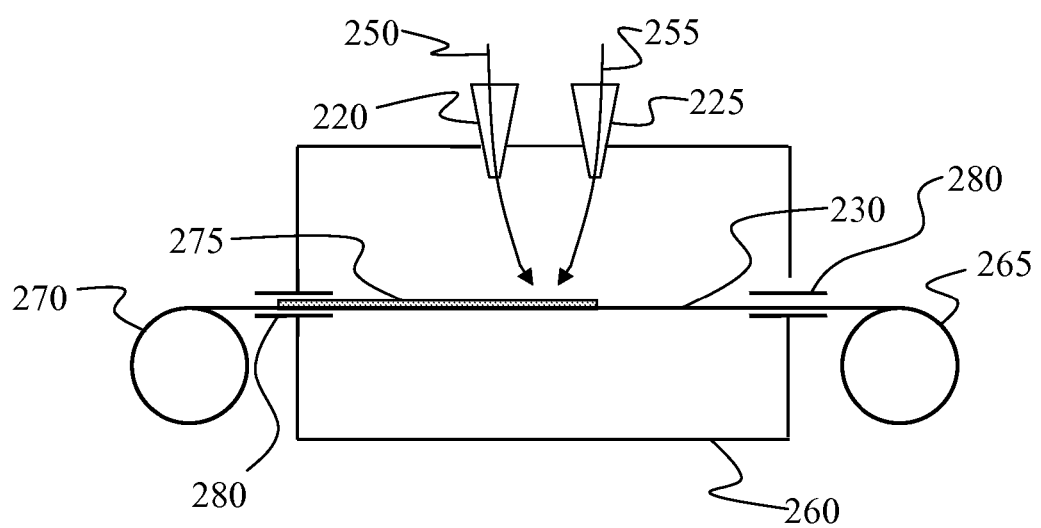
FIG. 14 depicts a portion of a deposition system that includes a moving continuous web substrate.

FIG. 14 shows a portion of a deposition system in accordance with the instant invention that includes a continuous web substrate. The deposition system includes deposition chamber 260 equipped with continuous web substrate 230. Continuous web substrate 230 is in motion during deposition and is delivered to deposition chamber 260 by payout roller 265 and received by take up roller 270 after deposition of thin film material 275. Continuous web substrate 230 enters and exits deposition chamber 260 through isolation devices 280. Isolation devices 280 may be, for example, gas gates. Deposition chamber 260 receives streams 250 and 255 containing energized or activated deposition species from separate conduits (not shown) of a microwave applicator (not shown) as described hereinabove. Streams 250 and 255 enter deposition chamber 260 through inlets 220 and 225. Inlets 220 and 225 may correspond to outlets of conduits that pass through a microwave applicator. Streams 250 and 255 are directed to the surface of substrate 230 and combine or other react or interact to form thin film material 275. Deposition chamber may optionally be equipped with independent means for generating a plasma to further energize or activate streams 250 and 255. Additional deposition chambers may be operatively connected to deposition chamber 260 to permit formation of a multilayer thin film structure or device.

One important multilayer photovoltaic device is the triple junction solar cell, which includes a series of three stacked n-i-p devices with graded bandgaps on a common substrate. The graded bandgap structure provides more efficient collection of the solar spectrum. In making an n-i-p photovoltaic device, a first chamber is dedicated to the deposition of a layer of an n-type semiconductor material, a second chamber is dedicated to the deposition of a layer of substantially intrinsic (i-type) semiconductor material, and a third chamber is dedicated to the deposition of a layer of a p-type semiconductor material. In one embodiment, the intrinsic semiconductor layer is an amorphous semiconductor that includes silicon, germanium, or an alloy of silicon and germanium. The n-type and p-type layers may be microcrystalline or nanocrystalline forms of silicon, germanium, or an alloy of silicon and germanium. The process can be repeated by expanding the deposition apparatus to include additional chambers to achieve additional n-type, p-type, and/or i-type layers in the structure. A triple cell structure, for example, can be achieved by extending the apparatus to include six additional chambers to form a second and third n-i-p structure on the web. Tandem devices and devices that include p-n junctions are also within the scope of the instant invention.

Bandgap grading of multiple junction device structures may be achieved by modifying the composition of the intrinsic (i-type) layer in the separate n-i-p subunits. In one embodiment, the highest bandgap in the triple junction cell results from incorporation of amorphous silicon as the intrinsic layer in one of the n-i-p structures. Alloying of silicon with germanium to make amorphous silicon-germanium alloys leads to a reduction in bandgap. The second and third n-i-p structures of a triple junction cell may include intrinsic layers comprising SiGe alloys having differing proportions of silicon and germanium. In this way, each of the three intrinsic layers of a triple cell device has a distinct bandgap and each bandgap can be optimized to absorb a particular portion of the incident solar or electromagnetic radiation.

In one device configuration, the incident radiation first encounters an n-i-p structure that includes an amorphous silicon intrinsic layer. The amorphous silicon intrinsic layer absorbs the shorter wavelength fraction of the incident radiation (e.g. shorter wavelength visible and ultraviolet wavelengths) and transmits the longer wavelength fraction (e.g. middle and longer wavelength visible and infrared wavelengths). The longer wavelength fraction next encounters a second intrinsic layer that includes a silicon-germanium alloy having a relatively lower germanium content. The second intrinsic layer absorbs the shorter wavelength portion (e.g. middle wavelength visible portion) of the longer wavelength fraction transmitted by the amorphous silicon intrinsic layer and transmits the longer wavelength portion (e.g. long wavelength visible and infrared wavelengths) to a third intrinsic layer having an intrinsic layer that includes a silicon-germanium alloy with a relatively higher germanium content. By grading the bandgaps of the intrinsic layers, more efficient absorption of the incident radiation occurs and better conversion efficiency is achieved.

In addition to compositional variation, bandgap modification may also be achieved through control of the microstructure of the intrinsic layer. Polycrystalline silicon, for example, has a different bandgap than amorphous silicon and multilayer stacks of various structural phases may be formed with the instant continuous web apparatus. The nanocrystalline and intermediate range order forms of silicon can provide bandgaps between the bandgap of crystalline silicon and the bandgap of amorphous silicon.

Another important multilayer structure is the p-n junction. In conventional amorphous silicon or hydrogenated amorphous silicon, the hole mobility is too low to permit efficient operation of a p-n junction. The low hole mobility is a consequence of a high defect density that leads to efficient trapping of charge carriers before they can be withdrawn as external current. To compensate for carrier trapping, an i-layer is often included in the structure. With the material prepared by the instant invention, the defect concentration in n-type or p-type material is greatly reduced and efficient p-n junctions can be formed from silicon, germanium, and silicon-germanium alloys. Alternatively, p-i-n structure can be formed in which the i-layer thickness necessary for efficient charge separation is much smaller that is required for current devices.

Those skilled in the art will appreciate that the methods and designs described above have additional applications and that the relevant applications are not limited to the illustrative examples described herein. The present invention may be embodied in other specific forms without departing from the essential characteristics or principles as described herein. The embodiments described above are to be considered in all respects as illustrative only and not restrictive in any manner upon the scope and practice of the invention. It is the following claims, including all equivalents, which define the true scope of the instant invention.

We claim:

1. A deposition process comprising:
providing a substrate;
providing microwave radiation;
providing a window spaced apart from said substrate, said window transmitting said microwave radiation;
providing a first material stream directly adjacent to said window, said first material stream including a first precursor comprising silicon or germanium, said first material stream receiving said transmitted microwave radiation, said transmitted microwave radiation exciting said first material stream to form deposition species, said deposition species not forming a film on said window;
transporting said deposition species toward said substrate; and
combining said transported deposition species with a second precursor, said transported deposition species and said second precursor forming a film on said substrate, said transported deposition species and said second precursor not forming a film on said window.

2. The deposition process of claim 1, wherein said first material stream further comprises fluorine.

3. The deposition process of claim 2, wherein said first material stream comprises $SiF_4$.

4. The deposition process of claim 2, wherein said second precursor comprises silicon.

5. The deposition process of claim 4, wherein said second precursor further comprises hydrogen.

6. The deposition process of claim 5, wherein said second precursor comprises silane or disilane.

7. The deposition process of claim 6, wherein said first material stream comprises $SiF_4$.

8. The deposition process of claim 1, wherein said first material stream lacks hydrogen.

9. The deposition process of claim 1, wherein said film comprises amorphous silicon.

10. The deposition process of claim 9, wherein said film is formed at a deposition rate of at least 20 Å/s.

11. The deposition process of claim 9, wherein said film is formed at a deposition rate of at least 50 Å/s.

12. The deposition process of claim 9, wherein said film is formed at a deposition rate of at least 100 Å/s.

13. The deposition process of claim 9, wherein said film is formed at a deposition rate of at least 150 Å/s.

14. The deposition process of claim 1, wherein said second precursor is not activated by said microwave radiation.

15. The deposition process of claim 14, wherein said first material stream comprises $SiF_4$ and said second precursor comprises $SiH_4$.

16. The deposition process of claim 15, wherein the molar flow rate ratio $SiH_4:SiF_4$ is between 0.6 and 4.0.

17. The deposition process of claim 14, wherein said first material stream comprises $SiF_4$ and said second precursor comprises $Si_2H_6$.

18. The deposition process of claim 17, wherein the molar flow rate ratio $Si_2H_6:SiF_4$ is between 0.3 and 2.0.

* * * * *